(12) United States Patent
Van Den Ende et al.

(10) Patent No.: US 10,892,690 B2
(45) Date of Patent: Jan. 12, 2021

(54) ACTUATOR DEVICE AND ARRAY OF THE SAME

(71) Applicant: KONINKLIJKE PHILIPS N.V., Eindhoven (NL)

(72) Inventors: Daan Anton Van Den Ende, Eindhoven (NL); Cornelis Petrus Hendriks, Eindhoven (NL); Valentina Lavezzo, Eindhoven (NL); Mark Thomas Johnson, Eindhoven (NL); Herbert Lifka, Eindhoven (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 521 days.

(21) Appl. No.: 15/577,920

(22) PCT Filed: Jun. 3, 2016

(86) PCT No.: PCT/EP2016/062657
§ 371 (c)(1),
(2) Date: Nov. 29, 2017

(87) PCT Pub. No.: WO2016/193432
PCT Pub. Date: Dec. 8, 2016

(65) Prior Publication Data
US 2018/0175746 A1   Jun. 21, 2018

(30) Foreign Application Priority Data

Jun. 3, 2015 (EP) ..................... 15170384
Oct. 14, 2015 (EP) ..................... 15189819

(51) Int. Cl.
*H02N 2/02* (2006.01)
*H01L 41/04* (2006.01)
(Continued)

(52) U.S. Cl.
CPC ........... *H02N 2/025* (2013.01); *H01L 41/042* (2013.01); *H01L 41/053* (2013.01); *H01L 41/0926* (2013.01); *H01L 41/193* (2013.01)

(58) Field of Classification Search
CPC ... H02N 2/025; H01L 41/0926; H01L 41/042; H01L 41/053; H01L 41/193
See application file for complete search history.

(56) References Cited

U.S. PATENT DOCUMENTS 5,713,150 A   2/1998 Ealovega
8,552,846 B2   10/2013 Cordoba
(Continued)

FOREIGN PATENT DOCUMENTS

CN   1841105 A   10/2006
CN   101345493 A   1/2009
(Continued)

OTHER PUBLICATIONS

Iqbal et al "Photo-Responsive Shape-Memory and Shape-Changing Liquid-Crystal Polymer Networks" Materials 2013, 6, 116-142.
(Continued)

*Primary Examiner* — J. San Martin
(74) *Attorney, Agent, or Firm* — Schott, P.C.

(57) ABSTRACT

An actuator device comprises an EAP structure which deforms in response to a drive signal applied to the device, a device output being derived from movement of the EAP structure. A delay arrangement is used such that the mechanical output from the device is not generated for a first range or type of applied drive signals, and said device output is generated for a second range or type of applied drive signals. This device is for example particularly suitable for use in a passive matrix system.

21 Claims, 10 Drawing Sheets

(51) Int. Cl.
  *H01L 41/09* (2006.01)
  *H01L 41/053* (2006.01)
  *H01L 41/193* (2006.01)

(56) References Cited

U.S. PATENT DOCUMENTS

| | | | |
|---|---|---|---|
| 2005/0057118 A1* | 3/2005 | Chemisky | F02D 41/2096 310/314 |
| 2013/0044049 A1* | 2/2013 | Biggs | H01L 41/083 345/156 |
| 2015/0146080 A1 | 5/2015 | Morita | |
| 2019/0089353 A1* | 3/2019 | Araumi | G06F 3/044 |

FOREIGN PATENT DOCUMENTS

| | | |
|---|---|---|
| CN | 104640708 A | 5/2015 |
| DE | 19905340 A1 | 8/2000 |
| DE | 102008044741 A1 | 3/2010 |
| DE | 102011117778 B3 | 10/2012 |
| JP | 2002-140995 A | 5/2002 |
| JP | 2003-282988 A | 10/2003 |
| JP | 2010-085798 A | 4/2010 |
| JP | 2013-533461 A | 8/2013 |
| WO | 9721974 A1 | 6/1997 |

OTHER PUBLICATIONS

Cuypers et al "Large amplitude light-induced motion in high elastic modulus polymer actuators" J. Mater. Chem. 2005, 15, 5043-5048.
Li et al "Synthesis of a Photoresponsive LiquidCrystalline Polymer Containing Azobenzene" Macromol. Rapid Commun. 2009, 30, 1928-1935 2009.
Curley et al "Light-driven actuators based on polymer films" Optical Engineering vol. 45, Issue 3, Mar. 2006.
Harris et al "Large amplitude light-induced motion in high elastic modulus polymer actuators" (2005). Journal of Materials Chemistry, 15(47), 5043-5048.

* cited by examiner

ACTUATOR DEVICE AND ARRAY OF THE SAME

CROSS-REFERENCE TO PRIOR APPLICATIONS

This application is the U.S. National Phase application under 35 U.S.C. § 371 of International Application No. PCT/EP2016/062657, filed on Jun. 3, 2016, which claims the benefit of the EP Patent Application 15189819.4, filed on Oct. 14, 2015 and also claims the benefit of EP Patent Application No. EP 15170384.0, filed on Jun. 3, 2015. These applications are hereby incorporated by reference herein.

FIELD OF THE INVENTION

This invention relates to actuator devices and their use, which devices make use of active materials and are capable of showing a threshold like drive response curve.

The invention also relates to systems comprising a plurality (array) of such devices, methods and computer program products of driving such systems.

BACKGROUND OF THE INVENTION

Electro- or optoactive materials are materials that show mechanical deformation when electrically or optically driven with a suitable control signal. Certain classes of these materials also exhibit the converse effect, i.e. they can provide an electrical or optical signal when subjected to mechanical deformation. The exact mechanism by which the above effects occur is dependent on the material of choice and in some cases also on the way of embedding them an a device. Because of the above effects, the most common applications of such materials are in actuators and/or sensors.

Electroactive polymers (EAP) and optoactive polymers (OAP) are emerging an emerging classes of materials. They combine their favourable actuation-response properties with a number of advantageous engineering properties, therewith allowing use in new application areas. Thus, e.g. an EAP generally exhibits a relatively large deformation and force in a small volume or thin form factor, compared to common other mechanical actuators or actuators based on inorganic EAMs. EAPs also give noiseless operation, accurate electronic control, fast response, and the possibility of high resolution and cyclic actuation with a large range of possible actuation frequencies, such as 0-20 kHz. OAPs provide other advantages. And all of these properties and advantages come with easy manufacturing into various shapes using well established methods allowing easy integration into a large variety of systems.

EAPs and OAPs can be particularly advantageously used in any application in which a small amount of movement of a component or feature is desired. Similarly, the technology can be used for sensing small movements.

As an example of EAP device operation, FIGS. 1 and 2 show two possible operating modes for an EAP based device. The device comprises an EAP layer 14 sandwiched between electrodes 10, 12 on opposite sides of the EAP layer 14. While in FIG. 1 the EAP layer is freely moveable, in FIG. 2 the whole EAP layer and its electrodes are clamped with one layer side to a support carrier layer 16. A voltage difference (drive signal) applied over the electrodes 10 and 12 is used to provide an electric field over the EAP layer to cause the EAP layer to expand in all directions as shown. While in FIG. 1 this leads to deformation of the EAP layer due to the layer being freely suspended, the same actuation in FIG. 2 leads to bending of the device due to the restrained freedom of motion by the clamping. Using device engineering a vast variety of device outputs can be invoked upon actuation of the EAP layer, i.e upon driving of the device. Thus, to obtain the asymmetric curving around an axis as shown, molecular orientation (film stretching) may for example be applied, forcing the movement in one direction. The expansion in one direction may result from the asymmetry in the EAP layer, or it may result from asymmetry in the properties of the carrier layer, or a combination of both.

An EAP or OAP based device, like those of FIGS. 1 and 2 typically is analogue devices, which means that the drive vs output response curve is a continuous curve. Hence, any signal other than a zero level/intensity signal will lead to an actuation output. However, a desirable and useful property in some applications (e.g. a matrix array of such devices) is to have a device that renders an output effect only above a certain threshold driving.

SUMMARY OF THE INVENTION

It is an object of the invention to define a device that can provide an actuation output based on driving of an electroactive or optoactive material based actuation arrangement where the device has a threshold like drive-output response behavior. It is a further object to provide systems comprising a plurality of such devices and methods of driving such systems.

These and other objects are at least partly achieved by the invention as defined by the independent claims. The dependent claims provide advantageous examples or embodiments.

According to the invention there is defined a device for providing an actuation output in response to a drive signal, the device comprising:

an actuation arrangement for providing a mechanical actuation, the actuation arrangement comprising an active material (20) that can deform upon applying a drive signal to the actuation arrangement to therewith cause the mechanical actuation, the actuation output being dependent on the mechanical actuation.

With actuation output is meant one or more of a force, pressure or movement/stroke type of output. The mechanical actuation can be a force and/or strain and/or stroke/movement. The mechanical actuation causes the response of the actuation arrangement and is based on the characteristic of the active material to allow or invoke (generate) its own deformation (a change in size and/or shape) when a drive signal is applied to the actuation arrangement.

The active material can be an electroactive material or an optoactive material and is a material that is capable of allowing, causing or invoking the mechanical actuation. Examples and classes of suitable materials will be described herein below.

The drive signal to be used is dependent on the active material of choice. Thus for an electroactive material, the drive signal can be an electrical signal such as a voltage signal or a current signal. Likewise, for an optoactive material, the drive signal is an optical signal. Some materials allow both to be used each with its own actuation characteristics. The drive signal can also be an electrically or optically invoked signal, e.g. it can be an electrically invoked compression or stretching force signal. For example, for an electroactive arrangement including an electroactive material sandwhiched between two electrodes, a drive signal in the form of a voltage difference over the electrodes can cause a compressing force on the electroactive material which, because of this force, is compressed when the arrangement is driven.

The device of the invention is characterised by the fact that it comprises an
a delay arrangement having a delay interaction with the actuation arrangement such that the delay arrangement:
prevents the actuation output for a drive signal chosen from a first range or first type of drive signals; and
allows the actuation output for a drive signal chosen from a second range or second type of drive signals different from the first range or first type of drive signals.

The delay arrangement is configured such that it has an interaction with the actuation arrangement such that for one, or a range of, mechanical actuations invoked by the drive signal, such mechanical actuations are not allowed to or sufficient to provide the actuation output of the device while for another range of mechanical actuations at least a part of the mechanical actuation is transferred or used to provide the actuation output. In particular, this arrangement means that a first range or type of drive signals does not cause actuation of the device, whereas a second range or type does. The first range or type of drive signals does not exclusively consist of a zero signal, i.e. a signal that invokes the rest state of the device. It is meant to include at least on drive signal that would cause actuation of the actuation arrangement. This arrangement implements a threshold for driving.

Thus the delay arrangement, by implementing a threshold, enables an (actuator) device to have a more desirable drive-output behavior, e.g. when used on its own or when used in other systems or applications. For example, it can be advantageously used to avoid actuation in response to small noise signals (below the threshold) received by it, or in response to partial driving as typically can occur during driving of devices in an array using common connection lines for providing the drive signals to different devices of the array because of crosstalk signals. The invention also enables for example the driving with multiple level (grey scale) actuation driving in a passive matrix array as opposed to only two level driving for a non-threshold device. The invention thus enables devices that can be operated with improved reliability or predictability and that can be implemented in arrays and correspondingly driven with improved effect (e.g. less crosstalk).

The drive-output delay of a device according to the invention is defined by the way the actuation arrangement and the delay arrangement interact. Many implementations of the delay arrangement can provide this drive-output delay function. As will become clear hereinafter, there exist embodiments that will allow provision of a first drive signal to the actuation arrangement, while the device still provides no output either because the mechanical actuation is not transferred to an actuation output arrangement that provides the device output or because the actuation arrangement is directly or indirectly retained from providing its mechanical actuation. Alternatively, there exits embodiments wherein a first drive signal does not result in any drive signal to be applied to the actuation arrangement at all. Hence, in these embodiments even upon application of a drive signal to the device, there is no actual mechanical actuation generated and therewith also no actuation output.

The term "delay" is not intended to convey a time delay in providing the output of the device. It expresses the fact that an actuation output is delayed until a sufficient drive signal is reached or provided. If the drive signal is immediately at a sufficient level, there is preferably no, or need not be a time delay. However, if the drive signal ramps up, there can be a time delay caused as well. The delay arrangement can thus be interpreted to essentially be a threshold arrangement.

In the invention, the drive signal can be chosen from a first range and/or type of drive signals and the second drive signal can be chosen from a second range and/or type of drive signals different to the first range and/or type of drive signals. The term "range" does not imply only a set of drive voltage signals and/or levels, although this may be the case. The first range or type of drive signals can comprise a drive level that is lower than that of the second range or type of drive signals. The onset of the second range of drive levels can define a threshold drive level. The two ranges preferably abut each other, being separated only by the threshold level. The threshold drive signal then delimits the first and second drive signal ranges. In addition or alternatively, the first range or type of drive signals can comprise a frequency that is different from (preferably lower than) that of the second range or type of drive signals.

Dependent on the actuation material used in the device, the drive signal can be an electrical signal, such as a voltage signal, a current signal, or power signal. In that case the drive level can be for example any one of: a voltage level, a current level, a power level. These signals can be direct current and/or alternating current. The signals can be pulsed signals with various pulse shapes etc. For electric field driven actuation materials, the drive signal preferably is a voltage drive signal. Thus, the second range may be above a threshold voltage signal while the first range can be below the threshold voltage signal. However, the first and second ranges of drive signals may differ in different ways dependent on the active material used, for example in the case of current driven materials (ionic movement based) materials, the drive signal preferably is a current drive signal. In this case, a drive signal may be characterized also or solely by its polarity. The non-actuation signal could be a high current signal with one polarity, or a signal for a short time period which is insufficient to build up a particular level of charge. The actuation signal could be with a lower current of opposite polarity or for a longer time period. Thus, the characteristics of the different drive signals which are suppressed or allowed to actuate the device may differ in various ways.

Optoactive materials can deform upon application of specific optical signals. For example based on interaction (absorption/scattering) of such material with radiation of a specific colour or frequency/wavelength, intensity or power of radiation, a structural material change can invoke a mechanical response. One example material operates on cis-trans isomerisation under influence of light as described herein below. Thus the first and second drive signal can differ with reference to one or more of the frequency, colour, power and intensity or its absorption and/or scattering by the material.

As indicated hereinabove, the delay arrangement can be implemented in many ways all having the advantageous effects of the invention. Implementations can include specific arrangement and/or construction of parts, members or structures of the device, as will be described hereinbelow.

In some embodiments of the invention the actuation arrangement provides the desired actuation output directly as the mechanical actuation and it provides the output only when a certain threshold actuation of the actuation arrangement is achieved or when a certain threshold driving as achieved. This provides a simple design.

In other embodiments of the invention the delay arrangement comprises an actuation output arrangement. The latter arrangement then provides the actuation output of the device. Having the actuation arrangement (being the source of mechanical actuation) separate form the actuation output arrangement (being the source of the device output) allows implementation of the delay arrangement in a more easy way as not all functions of the device need be incorporated in one arrangement and/or one active material. Thus, e.g. no redesign of active material with intrinsic delay of actuation upon driving would be needed. The actuation output arrangement preferably comprises or consists of a mechanical structure or member. This member can be a stiff member (such as a spring type member) such that it requires a threshold force before it can provide the actuation output (e.g. before it can move).

In the invention, the actuation output arrangement and the actuation arrangement can be arranged such that: there exists a minimum gap between them; and the mechanical actuation reduces the minimum gap such that: the mechanical actuation is at best sufficient to close the minimum gap for a drive signal chosen from the first range or type of drive signals, and the mechanical actuation is at least sufficient to close the minimum gap for a drive signal chosen from the second range of type of drive signals.

Thus, the gap is at least partly reduced, or reduced to zero for a drive signal chosen from the first range or type of drive signals. The gap is thus chosen such that at least a first amount of mechanical actuation caused with this drive signal is not "transmitted" or "transformed" into the actuation output, i.e. this amount of mechanical actuation is, as it were, "allowed to happen or absorbed" within the gap. Only when the gap is reduced to a predetermined extent as the mechanical actuation progresses to driving with a drive signal chosen from the second range or type of drive signals is any mechanical actuation transmitted or transformed into actual actuation output.

This design makes use of a gap which first has to be partly or completely spanned/bridged by the actuation of the actuation arrangement before an actuation output of the device occurs. This design has the advantage that no mechanical actuation force need be lost (overcome) by opposing forces used to provide any delay (e.g. due to actuation retaining arrangements as implemented below).

The delay arrangement can comprise: an actuation transmission arrangement for providing the delay interaction such that: the mechanical actuation is absorbed by the actuation transmission arrangement for a drive signal chosen from the first range or type of drive signals; and that at least a portion of the mechanical actuation is transmitted by the actuation transmission arrangement to the actuation output arrangement for a drive signal chosen from the second range or type of drive signals.

The absorption is such that the mechanical actuation does not cause any actuation output. The transmission of the actuation is such that it does thereby cause any actuation output.

The delay arrangement can thus be constructed such that the interaction between the actuation arrangement and the actuation output arrangement occurs through a transmission arrangement. This latter arrangement is designed to only for the drive signal chosen from the second range or type of drive signal cause that the mechanical actuation is at least partly transmitted to the actuation output arrangement to thereby generate the actuation output. The design can make use of any kind of force operating between the actuation arrangement and the actuation output arrangement. Absorbing means accommodating without transmitting the mechanical actuation to the actuation output arrangement.

The actuation transmission arrangement can comprise or consist of a mechanical arrangement/structure. It can be connected to the actuation arrangement and to the actuation output arrangement permanently, but this does not need to be so. It can include any kind of construction that has a first part connected to the actuation arrangement that allows a rotating movement and/or sliding movement or deformation before it causes a second part connected to the actuation output arrangement to make a rotating movement and/or sliding movement or deformation thereby generating the actuation output.

The transmission arrangement can also be implemented using electromechanical means. For example, the transmission arrangement can include means to generate an opposing electrical or magnetic force between the actuation output arrangement and the actuation arrangement in combination with a gap between the actuation output arrangement and the actuation arrangement such that a first gap reduction signal may be used to increase the electrical or magnetic force operating to a level where it becomes high enough to cause actuation of the actuation output arrangement. Further gap reduction with the second drive signal then causes the actual actuation output. This may be called indirect transmission of the mechanical actuation to the actuation output arrangement. Thus, the force field can be used to absorb part of the mechanical actuation before the remainder of any mechanical actuation transforms into actuation output. This can also be combined with a predetermined stiffness within the actuation output arrangement such that it requires a threshold force before it can provide an actuation output. Other arrangements/constructions will be described herein below.

The actuation transmission arrangement can comprise one or more parts for causing a magnetic force and/or an electric force to operate between the actuation arrangement and the actuation output arrangement thereby to provide the delay interaction. Such parts can include permanent magnets, electromagnets or electrodes, capacitively operating electrode arrangements, coiled wires etc.

The delay arrangement can comprise a retaining arrangement for imposing a threshold force to the actuation arrangement to implement the delay interaction, which threshold force works against the mechanical actuation and is chosen such that: the force delivered by the mechanical actuation for a drive signal chosen from the first range or type of drive signals is not large enough to overcome the threshold force; and such that force delivered by the mechanical actuation for a drive signal chosen from the second range or type of drive signals is large enough to overcome the threshold force.

If the device comprises an actuation output arrangement, then the threshold force can be imposed on the actuation output arrangement, the actuation arrangement or both. If it is imposed on the actuation output arrangement it will then indirectly also retain the actuation arrangement as the two interact. There may be no actuation output arrangement, in which case the retaining arrangement is for directly retaining the actuation arrangement. In all cases there is a first range or type of drive signals that will not result in a mechanical actuation sufficient to provide an actuation force that can overcome the threshold force imposed by the retaining arrangement. Preferably, the device or delay arrangement can include a fixed support or support structure against which the retaining arrangement provides its retaining function.

There are multiple ways to implement retaining arrangements. The retaining system can comprise one or more of the following: a mechanical retaining system, an electrostatic retaining system or magnetic retaining arrangement.

Whereas the mechanical retaining arrangement operates with mechanically defined retaining forces, the electromechanical retaining system operates with electrostatic retaining forces and the magnetic retaining system operates with magnetic retaining forces.

The retaining arrangement can comprise a spring or stiff substrate integrated or connected to the actuation arrangement. Preferably the spring or substrate would be a snap type spring or substrate. The retaining arrangement system can comprise one or more spring operated retention hooks or latches, one or more pressure gauges for providing a pressure induced retaining force. The spring can be in the form of spring or rubber unit type or unit for providing air or hydrostatic pressure, or other type.

The retaining arrangement effectively provides a retaining force opposing the force generated by the the actuation arrangement. Although this retaining arrangement may in some embodiments reduce actual actuation output forces (due to permanent opposing retaining forces subtracting from actuation forces), a proper design can have the advantage that stroke range is increased with respect to delay arrangements operating with an actuation transmission arrangement as described hereinabove.

The retaining arrangement can comprise a support layer (182) arranged in frictional engagement with the actuation arrangement (180) and/or the actuation output arrangement for providing the threshold force. The threshold force can then be a frictional force. The frictional engagement is such that for the first range or type of drive signals, the actuation arrangement and/or the actuation output arrangement cannot move with respect to the support layer thereby preventing the actuation output and is also such that for the second range or type of drive signals the actuation arrangement and/or the actuation output arrangement can indeed move with respect to the support layer thereby allowing the actuation output. This design is appropriate for a situation in which e.g. the movement induces a sliding motion. The friction can be advantageously influenced (e.g. reduced or removed) using different types of drive signals. Thus the first type of drive signal can be one without an alternating signal while the second type of drive signal can be one with an alternating signal. Alternatively, both types of signals can have alternating signals while the frequency of the first type is below a threshold frequency (no movement possible), while that of the second type is above the threshold frequency (movement possible). Alternatively, the frequencies are the same, but the amplitudes are different. With stronger driving (higher amplitude) a higher force to overcome the friction is created.

The delay arrangement can comprise one or more parts for applying and/or devices for generating a magnetic force and/or an electric force to operate on the actuation arrangement and/or the actuation output arrangement for providing the retaining force or threshold force.

The retaining arrangement can be designed to operate with a retaining force that is an attractive force and/or that is a repulsive force between appropriate parts.

Again the parts for applying or generating the magnetic or electric forces can comprise: magnets (permanent or electromagnets), or one or more electrodes possibly in combination with charge sources (voltage or current).

An advantageous way of implementation of electrical force for a retaining arrangement is by providing the arrangement with at least two electrodes, one of which is attached to the actuation arrangement and another one which is attached to the actuation output arrangement or a fixed support or support structure against which the retaining arrangement provides its retaining function. The electrodes can be chargeable with opposite charge so as to provide a attractive force or with same polarity charge to create repulsive forces. The advantage of using such field driven forces over direct mechanical forces is that they depend on the distance between the parts which exert the forces on each other. Hence driving will allow: increase of forces without transmission of any mechanical actuation up to some point where they become high enough to cause the transmission of at least a part of the mechanical actuation into the actuation output, or reduction of forces for the retaining up to some point where they can be overcome by the mechanical actuation forces so that mechanical actuation translates into actuation output.

The electrical implementation of the retaining force allows electrical tuning of the retaining force during operation of the device if needed without requiring redesign of the device. An extra drive signal can be used to adjust this threshold force. The retaining signal can also be partly or completely the same signal as the drive signal. This is advantageous in situations where the actuation force invoked by the drive signal is larger than the retaining force provided by the same drive signal applied to the retaining arrangement. The retaining arrangement can be tuned to ensure such a situation by relative location, sizes and dielectrics between the electrodes for creating the electrostatic force. Again, this retaining arrangement implements or causes a threshold to the driving signal.

The electromechanical retaining system can also comprise at least one permanent magnetic unit or electromagnetic unit for providing an electrostatic retaining force acting on the actuation member and/or the output member. Multiple configurations to implement such retaining system exist. Thus, the output member and/or the actuation member can comprise a magnetic unit while a fixed support or carrier part of the device comprises either also a magnetic unit or a material that reacts to the magnetic field generated. The permanent magnetic units have the advantage that they do not require magnetic field generation signals. Hence fixed threshold voltage is implemented via tuning of magnets etc. The retaining signal for an electrodynamic magnetic unit can be a different signal than the driving signal. This allows electrical tuning of the magnetic retaining force during operation of the device if needed.

In another set of examples, the delay arrangement comprises a drive signal control component (110) configured for: receiving the drive signal; and for controlling application of the drive signal to the actuation arrangement such that: it does not apply the drive signal capable of causing the actuation output to the actuation arrangement for a received drive signal chosen from the first range or type of drive signals; and such that it does apply the drive signal capable of causing the actuation output to the actuation arrangement for a received drive signal chosen from the second range or type of drive signals.

Thus, this delay arrangement comprises a component which implements a threshold drive signal for controlling the application of the drive signal to the actuation arrangement. In this way, the drive signal is partly or entirely prevented from reaching the actuation arrangement of the device until a threshold drive signal is reached.

The drive signal control component can comprise or consist of an electrical component (110) and/or an optical component for implementing a threshold drive signal that must be overcome by the received drive signal before a drive signal is applied to the actuation arrangement. In case of an electrical component it can implement a threshold voltage such as with e.g. an electrostatic discharge device. In case of an optical component it can implement a threshold light intensity, and/or a light frequency such as with a light filter or optical switch.

The drive signal control component can comprise: a further actuation arrangement for providing a further mechanical actuation, the further actuation arrangement comprising a further active material that can deform upon applying the drive signal to the further actuation arrangement to therewith cause the further mechanical actuation, the further actuation arrangement being arranged for receiving the drive signal and for applying the drive signal to the actuation arrangement such that: the further mechanical actuation is not sufficient to cause application of the drive signal to the actuation arrangement for a drive signal chosen from the first range or type of drive signals; and such that the further mechanical actuation is sufficient to cause application of the drive signal to the actuation arrangement for a drive signal chosen from the second range or type of drive signals.

The further actuation arrangement typically operates in the same way as the actuation arrangement as based on the function of the further active material. Upon driving of the further actuation arrangement with the drive signal, its further mechanical actuation (based on the deformation of the further active materials) as invoked with a range or type of drive signals is not enough for it to provide the drive signal to the actuation arrangement. Hence such driving does not result in mechanical actuation and therewith not in actuation output of the device. Upon driving of the component with the drive signal of the second range or type, it provides the drive signal or at least part of it to the actuation arrangement so that actuation output can be generated.

This effectively can provide a series coupling of two actuation arrangements and the further actuation member and actuation member are thus actuated in sequence. The actuation members are thus arranged such that a predetermined amount of further mechanical actuation is needed for it to transfer or switch the drive signal to the actuation arrangement. The device can be configured such that the second one in the chain defines the main output of the device, and it is only triggered when the first one has reached a certain level of mechanical actuation. This certain amount then introduces the threshold in the driving signal. The further actuation arrangement can thus be smaller than the actuation arrangement such that the first is only a switching function while the latter has a load bearing function.

However, in an alternative design, the actuation arrangement and the further actuation arrangement may each define load bearing parts which are operated sequentially as a function of the drive signal to each provide the, or a part of the, device actuation output.

There may be a set of three or more actuation arrangements arranged to operate in series as described for the set of two actuator arrangements herein above. Upon deformation of one actuation member by a predetermined amount the applied drive signal is coupled to the next actuation member. In this way, a chain of devices is defined which operate in a sequence, in dependence on the drive level applied.

The further active material can be different from the active material to give design freedom for implementing the signal application function, i.e. to adjust the threshold signal. Such implementations can also be done by choice of geometrical or structural design of both actuation arrangements Preferably the active material and the further active material are the same. Hence this allows devices for which only one material type needs to be designed (can be in the same material or device layer) in and gives simpler device manufacture and/or smaller and/or more robust device design.

In some examples of the invention, the actuation arrangement comprises an electrode for receiving the drive signal; and the further actuation arrangement comprises a further electrode for providing the drive signal to the electrode, the electrodes being adapted such that: the electrode and the further electrode do not provide an electrical contact such that the drive signal can be transmitted to the electrode for a drive signal chosen from the first range or type of drive signals; and such that the electrode and the further electrode do provide an electrical contact such that the drive signal can be transmitted to the electrode for a drive signal chosen form the second range or type of drive signals.

Thus, upon driving of the device with a drive signal of the second range or type of drive signals the electrode and the further electrode become electrically coupled or connected to transfer the second drive signal or part of it to the actuation arrangement, while such connection or coupling is not established for a first range or type of drive signals. The electrical connection can be through capacitive, inductive or direct current (physical contact) coupling.

In case of optically driven active materials, any electrodes and/or further electrodes of the previously described embodiments can be replaced with a light guide and further light guide to provide or transmit or couple optical drive signals.

The invention also provides a system comprising a plurality of devices as defined according to the invention.

Preferably the plurality of devices is arranged in an array. More preferably the system is a passive matrix array. This array provides a cheap and easy to implement type of array where a delay type of device according to the invention allows simple addressing not only with two level driving, but also with multiple level driving (grey scale) and with reduced or without crosstalk.

In certain applications, an array of actuators can be useful, for instance in positioning systems and controlled topology surfaces. An array is an implementation of an array driving system using only row and column connections and has a lower cost and complexity than individually driven devices in an array. The array can be a linear or two dimensional array.

The system can comprise m first signal lines and n second signal lines, m and n representing integers and at least one of m and n being larger than 1, wherein each one of the plurality of devices is connected to a first signal line and to a second signal line for providing the drive signal to that one of the plurality of devices.

The first connection lines can be row lines for selecting or unselecting devices and the second connection lines can be data lines, or vice versa.

The system can further comprise a driver arrangement for: generating a select signal, a deselect signal and a data signal such that: the select signal and/or the data signal each individually provide the drive signal chosen from the first range or type of drive signals; and such that the select signal and the data signal together form the drive signal chosen from the second range or type of drive signals.

Together means combined are at least overlapping in time for a predetermined time period.

The driver arrangement can be connected to the m first signal lines and n second signal lines such that signals can be provided to each of the plurality of devices using m first signal lines and n second signal lines. Preferably, the select signals and deselect signals are provided through the m first signal lines while the data signals are provided through the n second signal lines. Thus, the device select signal can be Ssel, while the device unselect signal can be Sunsel. The data signal can be Sdr/data.

The driver arrangement can comprise an electrical circuit or integrated circuit for providing electrical driving signals. The drive signals can be voltage signals, including DC voltage signals and/or AC voltage signals in pulse for or otherwise. The driver arrangement can comprise a row driver and a column driver. The row driver can be for providing selecting- and unselecting signal to one or more rows and the column driver is for providing data signal to the devices.

The driver arrangement can also provide an optical switching system for providing optical signals. The signal lines can be light guides in e.g. strips (thin layers) or optical fibres. Such systems can have shutters or other light switches as well as other light manipulation parts.

The system with the driver now effectively could only need power and data input for operation. Alternatively, the power provision and data input provision are also part of the system. The power input could be electrical or optical as the case may require.

The driver arrangement enables any form of passive matrix addressing to be used.

Note that different drive levels may be generated by different drivers of the driver arrangement, i.e. the driver arrangement may be made up of a row driver and a column driver, which together deliver a set of different signal levels.

When the delay arrangement comprises a frictional engagement of the actuation arrangement and a support layer (as explained above), the system the driver can be configured for generating the select signal to comprise an alternating signal with a frequency capable of reducing the frictional engagement.

Preferably the frequency of the select signal is higher than that of the unselect signal. The driver can be for delivering first and second constant drive levels and a third alternating drive signal, wherein the device output is only generated in response to the combination of the second constant drive level and the alternating drive signal.

This arrangement makes use of an alternating signal to select or unselect the frictional coupling, and thereby enable the threshold to be overcome.

The invention can be used for all types electroactive materials (EAM). Electroactive polymers in general and at regular layer thicknesses do require relatively high operating voltages of tens of volts. Hence the drivers must be accommodated for that if needed. Preferably the invention is used for organic or even organic polymer materials or organic polymer comprising materials as these allow easy integration in complex devices such as arrays. Suitables materials are described herein after. Many of these materials provide a good balance between stroke and force while being integratable into various devices. So much is not always true for inorganic materials.

If the device comprises an electroactive material and/or further electroactive material, then preferably one or more electrodes are used to provide the drive signals. The one or more electrodes are preferably part of the actuation arrangement, and if present, the further actuation arrangement also comprises one or more electrodes. The electrodes preferably are attached to the arrangement. The electrodes preferably are arranged to provide an electric field the, or part of the, electroactive material and/or further electroactive material or to provide a current to the electroactive material and/or the further electroactive material.

If the device comprises an optically driven active material, then it preferably comprises light guiding parts to provide the optical drive signals to the actuation arrangements. Such light guiding parts can comprise: lenses, prisms, mirrors, strips, layers wires or tubes of optically transparent material, color/frequency filters, polarisation elements all according to need for guiding optical signals to the arrangements or active materials. Thus preferably, an actuation arrangement comprises at least one light guiding part or layer for guiding an the optical drive signal.

Any actuation arrangement can comprise one or more layers of active material. Preferably in such a way that contributions form the different layers add to each other.

The actuation arrangement and/or the further actuation arrangement can have a support layer or substrate limiting deformation of the active material in one or more directions. This can be used to cause a deformation of the active materials to result in a different type of mechanical actuation of the respective arrangements. One example of this is the backing layer described with reference to FIG. 2.

The invention provides a method of driving a system according to the invention. The method comprises instructing a driver arrangement to perform the following steps:
generating a select signal, a deselect signal and a data signal such that:
the select signal and/or the data signal each individually provide the drive signal chosen from the first range or type of drive signals; and
the select signal and the data signal together form the drive signal chosen from the second range or type of drive signals.

Generation of a split drive signal, i.e. one that is composed of a data signal part and a select or unselect signal part in combination with the device of the invention gives convenient driving of the system using line or column driving where cross contamination signals caused by the individual parts of the drive signal can be kept below a threshold of the device. Hence no crosstalk actuation output is observed with simple driving and allowing also the grey scale or multi level data signal driving.

In the method generating the select signal can comprise that the deselect signal and the data signal comprises that:
the select signal comprises a select signal level;
the unselect signal comprises an unselect signal level;
the data signal comprises a data signal level chosen from a group of levels consisting of at least a first level and a second higher level;
wherein the signal levels are chosen such that:
the absolute value of the difference between the data signal and the unselect signal provides the drive signal chosen form the first range or type of drive signals; and
the absolute value of the difference between data signal and the select signal provides either the drive signal chosen from the first range or type of drive signals, or provides the drive signal chosen from the second range or type of drive signals.

Generation of the data signal preferable comprises that it can have a data signal level chosen from a range of levels between the at least a first level and a second higher level.

The unselect signal level is preferably inbetween the select signal level and the data signal level. It is preferably a zero level. This can e.g be zero volt, current or zero light intensity. The select signal level and the data signal level preferably have opposite polarity or sign.

In case the plurality of devices is electrically actuated, the levels can be current levels or voltage levels. For optically actuated devices, the levels can be light intensities or frequencies.

The invention provides for a computer program product comprising computer readable code storable on, or stored on, a computer readable medium, or downloadable from a communications network, which code, when executed on a computer, is capable of implementing the steps of a method as claimed in any of the method claims.

BRIEF DESCRIPTION OF THE DRAWINGS

Examples of the invention will now be described in detail with reference to the accompanying schematic drawings, in which.

DETAILED DESCRIPTION OF THE EMBODIMENTS

The invention provides a device that can be an actuator device. The device comprises an actuation structure including an active material which can deform when subjected to a drive signal, a device output being derived from a mechanical actuation of the actuation structure caused by any deformation of the active material. The device further includes a delay arrangement which substantially prevents transformation of the mechanical actuation to the device output for a first range or type of drive signals. The device implements a threshold driving for the device output.

The device is for example particularly suitable for use in a passive matrix system. Ideally, in a passive matrix arrangement of devices, each individual actuator should be actuated up to a, or its maximum actuation without influencing the adjacent actuators. However, in practice some cross talk driving along the rows and the columns of the matrix to adjacent actuators is found to be present. When a drive signal (such as e.g. a drive voltage or current for an electroactive material based device) is applied to actuate one actuator, one or more actuators around it also experience a drive signal and will partially actuate, which is an unwanted effect for many applications.

The following explanation will be done for an array of electroactive material based devices. In particular the electroactive material is an electroactive polymer. However, the considerations also hold for arrays of devices employing other types of active materials and the corresponding drive signals.

Figure 3:
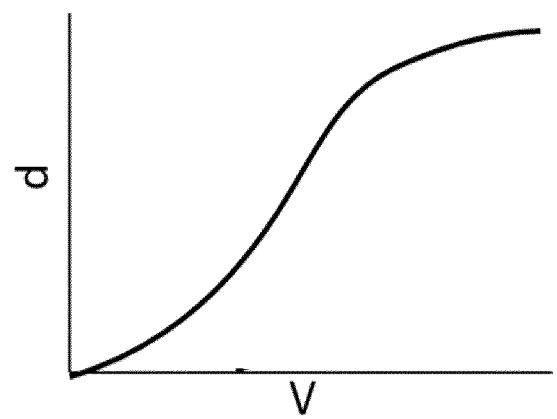
FIG. 3 shows a typical displacement-voltage characteristic for an EAP device.

The cross talk effect is among others due to the characteristics of the typical stimulus-response (drive-output) curve of an EAP. FIG. 3 shows such a curve in the form of the basic displacement (d) versus voltage (V) function for an electroactive polymer (EAP) structure. Although the curve shows non-linear response versus voltage driving, there already is a response from the onset of driving, the curve is substantially continuous.

Figure 4:
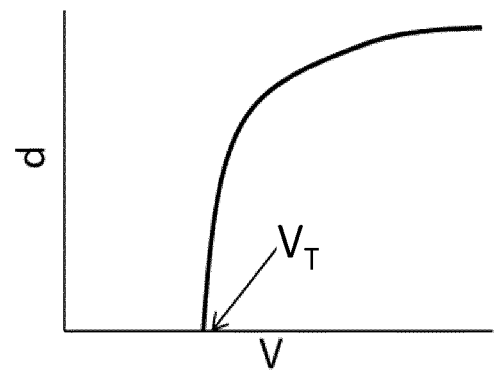
FIG. 4 shows a more desirable displacement-voltage characteristic of an EAP device as particularly to enable passive matrix addressing.

FIG. 4 shows an ideal desired drive-response curve to e.g. enable the device to be used in a passive matrix driving setup and scheme. In this case the device will not provide a substantial output until a certain threshold voltage $V_T$ driving is applied. Thus, for "first drive signal" that is smaller than $V_T$ there is no device output while for any "second drive signal" above $V_T$, there is a device output. A device with such curve, is tolerant towards some stimulus below $V_T$ that does not cause a resulting output. It is this tolerance that renders the device fit or improved for many applications and purposes, such as e.g. reduction or even prevention of the crosstalk. The invention allows implementation of the threshold driving without having to adjust or modify existing active (e.g. electroactive or opticoactive) materials, which can be a cumbersome process. Although explained for an electrically activated device having a threshold voltage, an analogous reasoning can hold for an electrically activated device having a threshold current, or an optically activated device having a threshold light intensity or threshold light frequency (color).

The invention provides device designs which give rise to an artificially created threshold driving. This threshold can be implemented using either mechanical effects or driving effects, or combinations of these. Various examples are given below, but others can be thought of without loss of the effect of the invention.

In the invention, a stimulus is the same as a drive signal. a drive signal can be an electrical signal if the device employs an electroactive material. Usually and preferably it is a voltage signal, but it can be a current signal and this is dependent on the actual electroactive material used in a device. Preferably the devices incorporates one or more electrodes or electrode arrangements to supply the drive signals to a part of or the entire area or volume of an electroactive material. In some cases, e.g. such as when electroactive elastomers are used in the electroactive material, the electrodes of an electrode arrangement are preferably attached to opposite sides of a layer of electroactive material in order for the electrodes to apply a force to the elastomeric material.

A drive signal can also be an optical signal in case of the device operating with optoactive material. In such case the device can also have parts for providing an optical signal to the material. Such parts can be light guides such as fibres and layers with specific transparencies. Also lenses or other optical components can be used.

A response or device output is meant to be some sort of a mechanical response of the device. It can be a shape change or partial or complete displacement or both of a part of the device, i.e. the output structure and/or the actuation structure. The output can also be a force or pressure provided with minimised or no actual deformation of an actuation output structure occurring.

The threshold effects may be implemented using a variety of output delay arrangements or mechanisms. One class or type is based on passive mechanical delay of actuation transformation to device output. This can be implemented by e.g. tailored device geometry (construction) and or mechanical transmission systems. Also active opposition of transformation of the actuation to the device output can be implemented. This can for example be done by introducing features that provide forces that oppose the mechanical actuation up to the threshold driving. Examples can be: mechanical clamping, surface "stickiness", opposing pressure, frictional effects, or other permanently or electrodynamically generated forces.

Thus, the threshold driving can be implemented in an actuator device based on actual opposing force that needs to be overcome by an actuated actuation structure. Alternatively, the device can be constructed such that an actuated actuation structure will only result in an actuation output structure to respond after some threshold amount of actuation response of the actuation structure has occurred. The delay arrangement or transmission structure effectively absorbs the actuation of the actuation structure up to certain threshold driving. Also electrically generated threshold driving effects may be implemented. This can for example be done using electrostatic, electrodynamic or magnetic attraction or electrical breakdown behavior. A combination of the above effects may also be used to efficiently implement a driving threshold.

The invention will be further explained with reference to the below examples based on a special kind of active materials named electroactive polymers EAPs. The invention is however not limited to such materials or the specific embodiments and those skilled in the art will be able to design other examples including e.g. other types of active materials according to the invention and having the effect of the invention.

Figure 2:
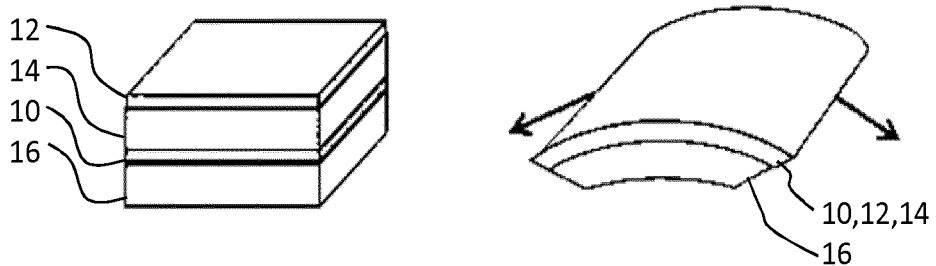
FIG. 2 shows a known EAP device which is constrained by a backing layer.
Figure 5:
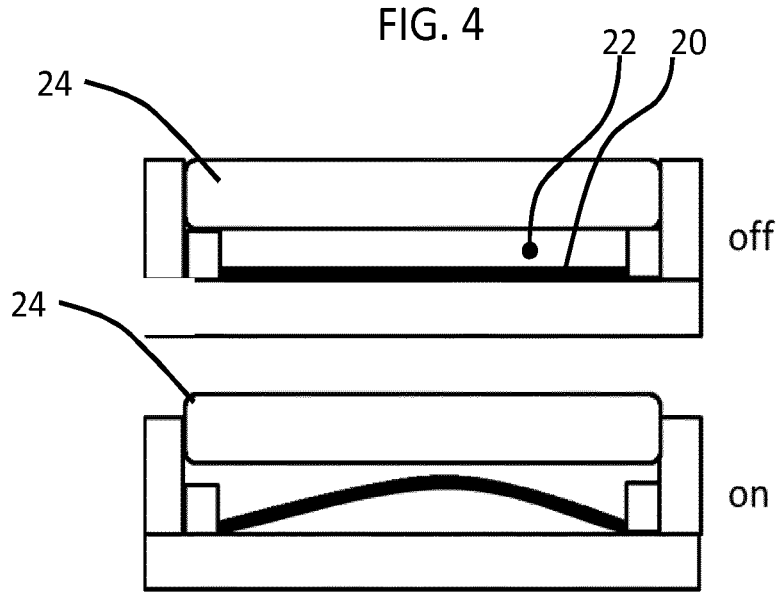
FIG. 5 shows a first example of EAP device.

FIGS. 5A and B show a first example of the invention based on a geometric or constructional effect, using a mechanical structure or design to implement the delay arrangement. The device comprises an EAP structure 20 as the actuation arrangement within a chamber 22. The chamber has a member (lid) 24 suspended over the EAP structure 20, leaving a gap 23 between the member and the EAP structure. The member lid is seated on a rim which means it is suspended over the EAP structure. The member 24 effectively forms an actuation output arrangement arranged to give the actual device output. Although not shown for clarity, the EAP structure has an electrode arrangement in order to drive the EAP with a voltage signal. For example the electrode and EAP configuration as shown in FIG. 2 of this application can be used. However, others can be constructed. Driving of the EAP with a first range drive signal (in this case voltages) makes it bend such that part of it is raised towards the member (lid) 24. Although the actuation structure is thus actuated with this first range of signals, there is no substantial device output yet, as the member 24 has not been contacted and/or displaced. After, the gap 23 has been bridged and thus contact has been made between the member 24 and the EAP layer (at the maximum drive signal within the first range of drive signals), further actuation of the device causes the EAP structure to become further actuated therewith causing the member to become contacted with increased force and/or with increased displacement (raised). Thus, there is a range of input drive signals which only cause movement of the EAP structure within the gap beneath the lid, without causing a device output. When the maximum drive signal (in this case highest voltage) in this range is reached, contact is made with the member and device output starts. This highest signal corresponds to the threshold drive signal (threshold voltage) of the overall device. Above this drive signal, further driving in a second range provides progressing pressurisation and/or displacement of the member (lifting of the lid), which corresponds to the output of the device.

Figure 6:
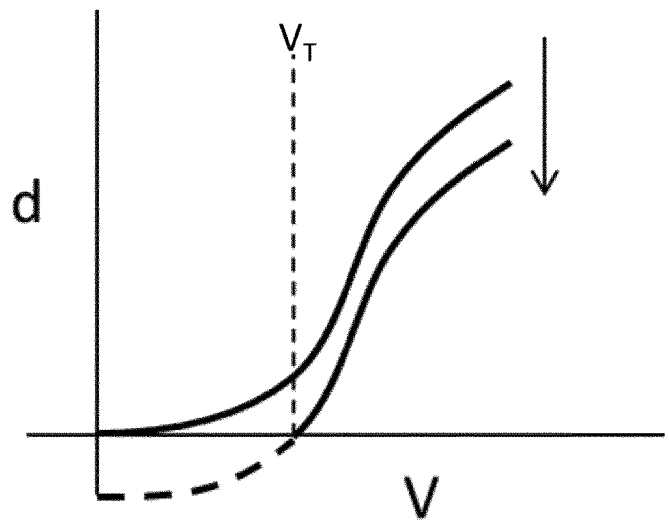
FIG. 6 shows how the device of FIG. 5 alters the displacement-voltage characteristic.

Thus, whereas a partially actuated element will not displace the member (lid), a fully actuated actuator will give displacement of that member. In order to obtain such threshold dependent device behavior, part of the displacement fully accessible with the EAP structure must thus be sacrificed. As shown in FIG. 6, the effect of the delay arrangement is thus to lower the displacement curve of the device so that there is no displacement until a threshold $V_T$ is reached. In this device, the construction has the effect of lowering the maximum displacement that would have been attainable based on the EAP structure if no gap had been introduced in the device. On the other hand, the advantage of this configuration is that no force needs to be overcome before the threshold driving so that a device output benefits the full range of force attainable with the actuation structure. Thus the device is useful for highest force reduced stroke applications.

The reduced maximum displacement can be circumvented when the delay arrangement imposes a force on the actuator that opposes the EAP actuation response up to a certain threshold force. In this case the delay arrangement effectively has a retaining arrangement. This can be implemented in many ways, with or without a displacement delay as with the gap, with or without sacrifice of actuation force and with or without (mechanical) interaction between the actuation structure and the actuation output structure. Examples will be given herein below.

Thus, the device can provide more displacement if its EAP actuator structure is clamped using a retainer system, for example a snap system to create a threshold voltage for actuation. This threshold voltage then corresponds to a required force to overcome the retainer function. With such a retainer system, once the retainer force is overcome, the device output benefits the full force available from the actuation structure. This effect, or a partial equivalent effect, can be obtained in general when upon driving beyond the threshold the retaining force reduces more strongly than the actuation force provided by the actuation structure. This can be with retainer forces that depend non-linearly or linearly on distance or on a or the driving signal (see also hereinbelow).

Figure 7:
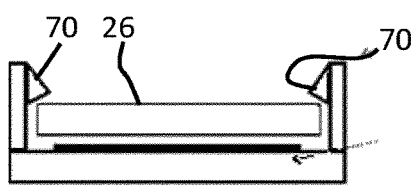
FIG. 7 shows a second example of EAP device.
Figure 7:
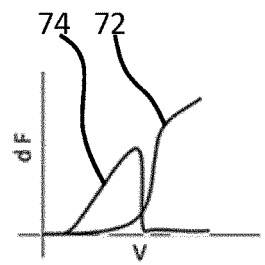

FIG. 7 shows an example having a retaining arrangement 70 in the form of snap hooks which the member (lid) 24 must pass before displacing. In this case there is no gap between the displacement member and the actuation member as was the case with the example of FIG. 5. The snap hooks require a threshold force to be applied to the member 24 before it can move past the hooks.

After the snap-through the actuator will keep increasing its displacement with more drive signal (applied voltage). When the voltage is removed, the system returns to its initial flat state. The snap hooks may allow free passage in the downward direction of the lid, or else the device may need to be reset by an additional applied force. Other ways of ensuring the reversibility of the device can work with the invention.

The displacement versus voltage characteristic (plot 72) as well as force versus voltage characteristic (plot 74) corresponding to the example of FIG. 7 are shown. Clearly, and in contrast to the example of FIG. 5, there is no sacrifice of EAP actuation displacement before actual device output is realized. The complete EAP output at a certain drive signal is just delayed and after overcoming the opposing force it becomes fully available in the device output.

In a further mechanical embodiment, the threshold voltage may be induced by adding a defined "stickiness" between the EAP structure (i.e. the polymer layer and its own substrate) and a support structure. The stickiness can only be overcome by increasing the voltage across the EAP layer until its force overcomes the stickiness of the system.

The stickiness could be implemented by either one or more of the following:

chemical modification of the surfaces (applying a glue-like property), introducing a fluid between the surfaces (using capillary forces), mechanical/topological modification of the surface, for example a "Velcro" like structure.

The examples above make use of a delay arrangement based on a mechanical structure, which for example defines the output of the device. An alternative is based on an electrostatic effect.

Figure 8:
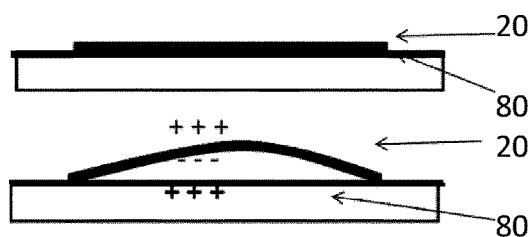
FIG. 8 shows a third example of EAP device.
Figure 8:
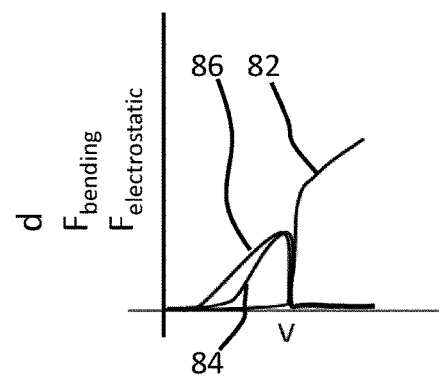

One example of an electrostatically induced force opposing the actuation is as shown in FIG. 8. The actuator has an EAP structure 20 including an electrode arrangement for its driving (again e.g. like the one of FIG. 2). The device has an additional electrode 80 on the device support surface below the EAP structure. This electrode is not in direct electrical contact with any one of the electrodes of the the drive electrode arrangement. There may for example be a gap or an insulating layer between the two to accommodate this. The electrostatic attraction between one electrode of the electrode arrangement of the EAP structure 20 and the extra electrode 80 on the surface creates a restrictive force which constrains displacement (in this case) bending. The electrostatic force is given by:

$$F_{electrostatic} = \frac{A\varepsilon_0\varepsilon_r}{d^2}V^2$$

and the bending force is a function of the EAP material properties. Thus, the delay arrangement comprises an electrode for applying an electrostatic force to the EAP structure.

If the electrostatic force is overcome by the bending force, the actuator will bend. This reduces the electrostatic force drastically, as the force is a function of the separation between the electrodes (d) squared. Any bending will increase d and the electrostatic force is reduced, leading to further bending and hence more reduction of F_electrostatic, and the threshold is overcome.

The graph in FIG. 8 shows the corresponding displacement versus voltage characteristic (plot 82), the force versus voltage characteristic (plot 84) and the electrostatic force versus voltage characteristic (plot 86).

An advantage of this system is that the electrostatic force is almost instantaneous and the EAP structure force is slow to respond, which is favorable for keeping the actuator tightly clamped at lower voltages. A dynamic effect can be realized by exploiting the difference in capacitance between the EAP structure and the substrate. In this configuration, the electrostatic force will work to constrain the EAP structure as soon as a voltage is applied. The EAP structure will however slowly build up to its maximum force from a step voltage input. This can cause a delayed threshold effect. Thus, when a step voltage is applied, the electrostatic force first holds the EAP structure down until the actuation force overcomes the electrostatic force threshold and pops up to give a displacement.

The threshold value can thus be determined partly by the geometry of the actuator and partly by the speed of actuation.

Figure 9:
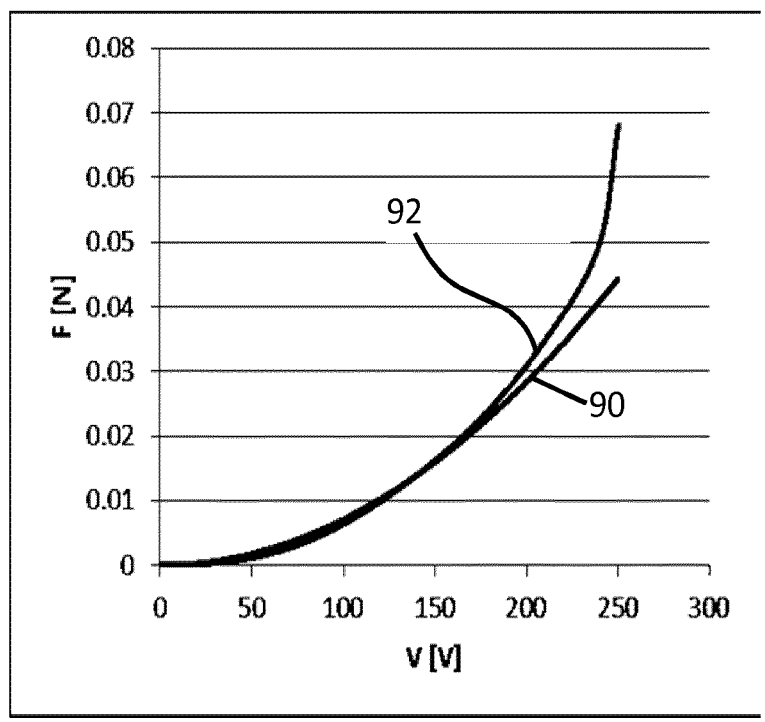
FIG. 9 shows the electrostatic force and displacement with respect to drive voltage for one device design based on the approach of FIG. 8.

For a square shaped actuator with a substrate with a relative permittivity of 3.5, area of 144 mm$^2$ and a thickness of 80 micrometers, the EAP layer force and electrostatic force is at equilibrium at a voltage of about 110V. This is shown in FIG. 9 which shows the electrostatic clamping force 90 and the EAP layer bending force 92.

Figure 10:
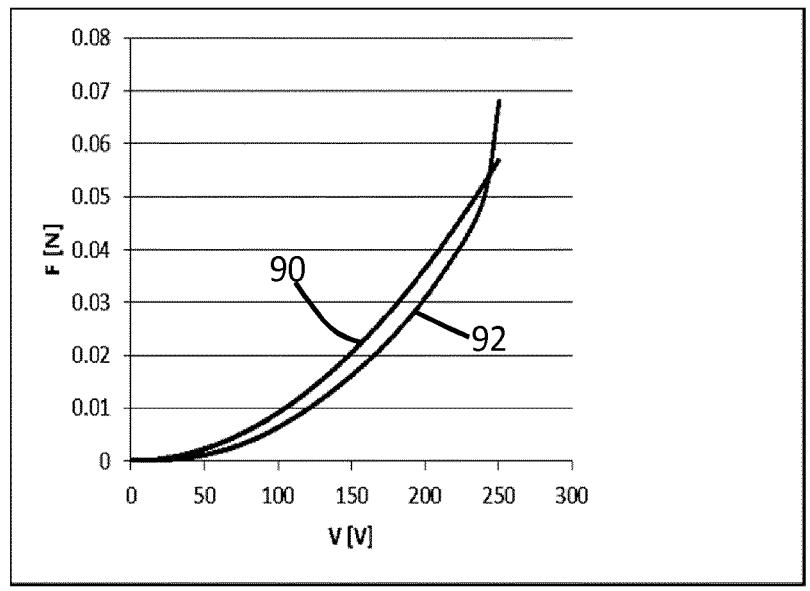
FIG. 10 shows the electrostatic force and displacement with respect to drive voltage for another device design based on the approach of FIG. 8.

For the same system with a substrate thickness of 70 micro meters, the threshold is about 240V as shown in FIG. 10. For this system, the capacitance of the electrostatic clamping capacitor is about 55 pF for FIG. 9 and 65 pF for FIG. 10, whilst the capacitance of the EAP layer is typically around 200-500 nF, which means the difference in charging time is about a factor of 3000.

Thus, the design can be tailored to the desired threshold voltage and the required response characteristics.

The previous example makes use of electrostatic forces. Similarly working embodiments, that is based on electrically induced forces, can be made using electromagnets. As a further example even permanent magnets can be used to accomplish the retaining effect. Thus, in analogy to the above electrostatically evoked opposing force, the device can have permanent- or electromagnets that are actively preventing EAP structure actuation up to a specific threshold driving. Thus, either one or both of the EAP structure and device support structure can have a magnetic layer or part and the other one of the either one of the EAP structure and device support structure can have a material that is attracted or repulsed from the magnet. The use of attractive or repulsive forces for creating the EAP actuation opposing force can be tailored by design or structure of the device as it is dependent on the relative location of parts causing such forces. This is true throughout the invention. The magnetic force can be tuned in order to create a threshold force as desired by tuning the magnets, materials and construction of the device taking into account parameters that contribute to such forces as known from standard electromagnetism considerations. Those skilled in the art will know how to do this using regular techniques.

Another possible implementation of the delay arrangement comprises a component introducing a threshold drive signal. One example is an electrical component which implements a threshold voltage or a breakover voltage for controlling the application of the drive signal to the EAP structure.

Figure 11:
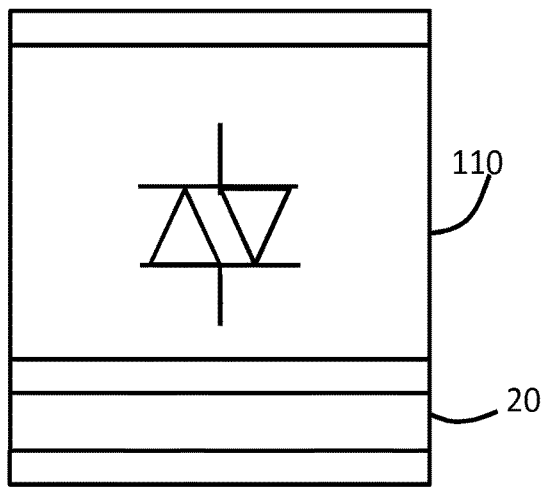
FIG. 11 shows a fourth example of EAP device.

FIG. 11A shows an example, in which the EAP layer 20 is connected electrically in series with an electrical threshold or breakover element 110 shown as a DIAC (diode AC switch). Other threshold elements may be used such as a Shockley diode, silicon controlled rectifier or other thyristor. This element may be part of the EAP structure, for example as organic semiconducting layers (in p-n-p-n sequence) as a part of the substrate stack. Alternatively for larger actuators in an array, the element can be a surface mount device component in series connection with each actuator.

For an applied voltage below the breakover or threshold voltage, there is no deformation induced as the voltage drop arises across the threshold or breakover element. For a larger applied voltage, the EAP layer will deform.

In case of optically driven actuators, such a component can be in the form of a OLED or LED. An OLED requires an electrical signal with threshold voltage like drive output curve. The light output can be tuned and suitable for activating an optoactive material structure. Also the component can have a non linear optical filter or an optical filter that allows passage of only a specific range of frequencies.

Another possible implementation for the delay arrangement comprises a component that incorporates a second actuation arrangement. As an example of such component an electroactive material based device can have an additional EAP structure as the component, wherein the additional EAP structure comprises an electrode for receiving the drive signal and applying it to the actuation arrangement of the device, wherein upon deformation of the additional EAP structure by a predetermined amount, the drive signal is coupled to the (main) EAP structure.

Figure 12:
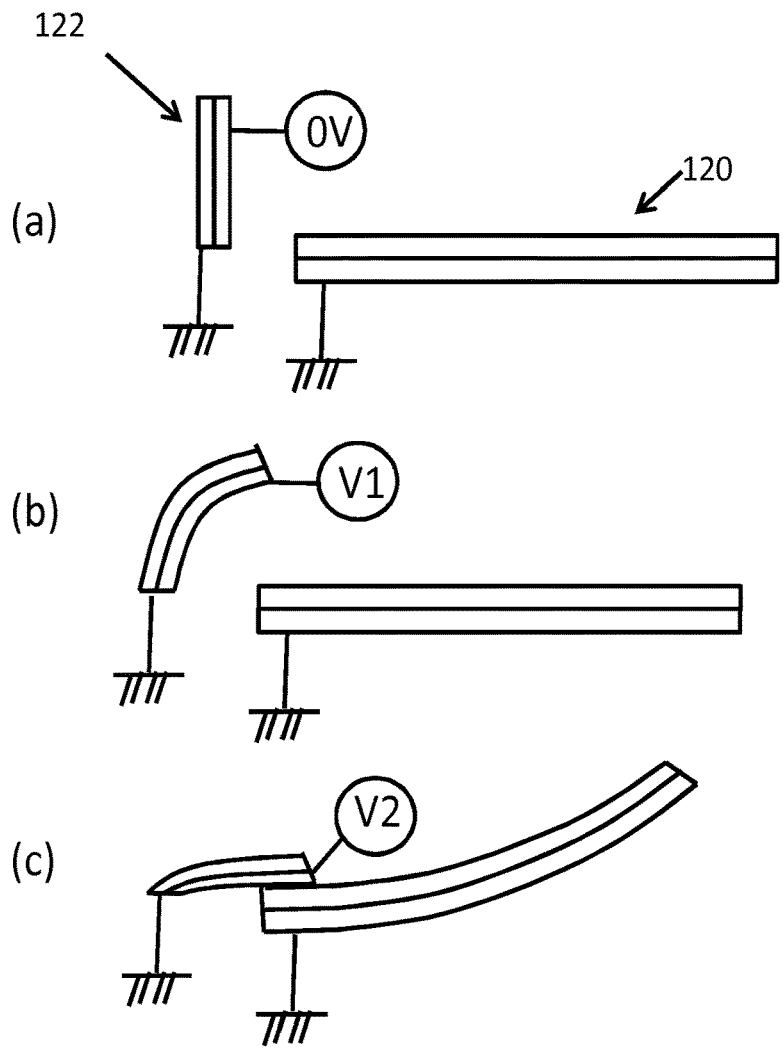
FIG. 12 shows a fifth example of EAP device.

FIG. 12 shows an example. The overall device comprises a main actuator 120 (which is "the EAP structure") and a subsidiary actuator 122 (which is "the additional EAP structure"). The subsidiary actuator is smaller than the main actuator and it defines a control part which in this case is a non-load bearing device.

The use of two sequential actuators enables a threshold to be implemented. The subsidiary actuator acts as a mechanical switch while the main actuator is the functional actuator. When the voltage is below the threshold voltage the switch is off, as shown for voltages V=0 and V=V1 in FIGS. 12(a) and 12(b).

At and above the threshold voltage, for example V=V2 as shown in FIG. 12(c), the switch is on and the functional actuator is at once fully powered to that voltage.

The contact between the two actuators provides contact of their driving electrodes, so that the subsidiary actuator delays the application of the drive voltage to the main actuator.

Figure 13:
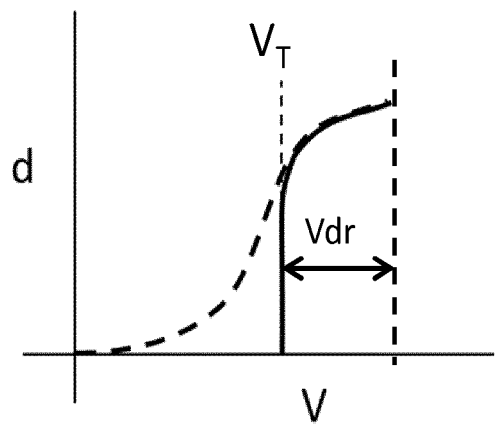
FIG. 13 shows how the device of FIG. 12 alters the displacement-voltage characteristic.

FIG. 13 shows the displacement function for the main actuator, and it can be seen that there is an abrupt cutoff of the displacement function. Thus a voltage signal below $V_T$ is a first drive signal giving no actuation of the device. Any voltage signal above $V_T$ is a second drive signal giving actuation output. The cutoff can be adjusted thru design by adjusting gap size between the actuators, or by adjusting the active materials and or active layer geometries such as thickness, that control the actuation field over the active materials.

The sequential ordering can be configured in several different ways with different actuator configurations and switching actuator geometries. Tailored construction is enabled. The contact can be made by the electrode of the EAP structure or by an additional contact pad made on the back side of the substrate, depending on the actuator geometry. Three examples are shown in FIGS. 14 (a) to 14 (c).

Figure 14:
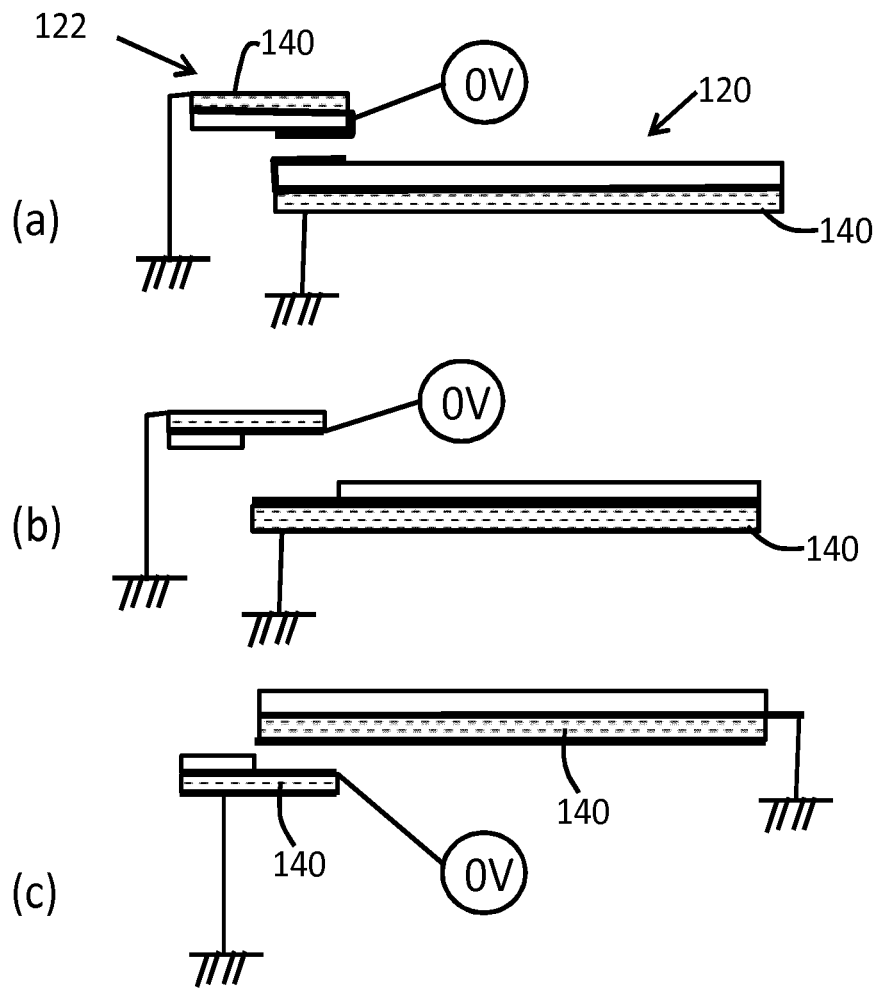
FIG. 14 shows a sixth example of EAP device.

In FIG. 14, each actuator is shown as an EAP layer 140 on a carrier layer. There are electrodes on opposite sides of the EAP layer 140, and one of these is grounded or put at an appropriate reference level. The non-grounded electrodes come into contact when the subsidiary actuator is deformed. The state of the three designs is shown with no applied actuation voltage, so before the subsidiary actuator is deformed.

In FIG. 14(a) the non-grounded electrode of each actuator is continued around the edge of the carrier layer, so that the carrier layers are brought into contact, and this makes the electrical connection between the non-grounded electrodes.

In FIG. 14(b), the EAP layer 140 extends beyond the area of the carrier, so that although the carrier layers face each other, it is the EAP layers, and their respective non-grounded electrodes, that are brought into contact.

In FIG. 14(c), the EAP layers face each other and their respective non-grounded electrodes are brought into contact.

Figure 15:
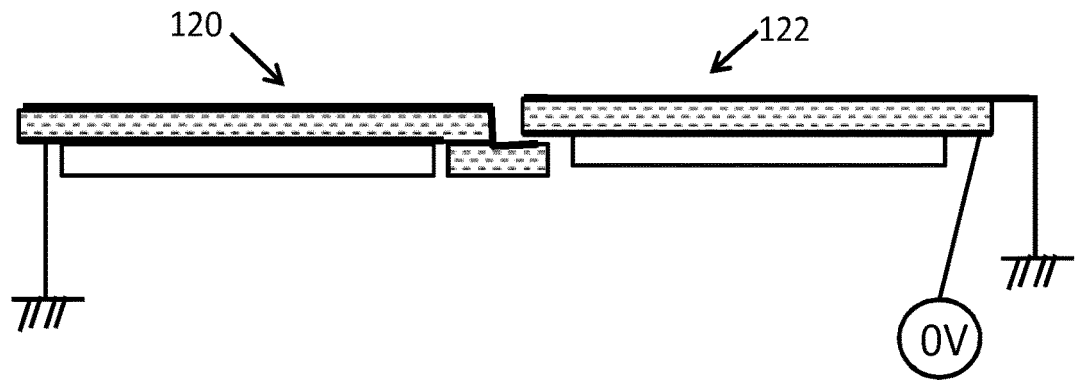
FIG. 15 shows a seventh example of EAP device.

FIG. 15 shows an implementation in which both actuators 120, 122 may be load bearing.

In this case, a first load bearing actuator 122 (which is the second (subsidiary) EAP structure) makes contact with a second load bearing actuator 120 (which is the (main) EAP structure). Both the first and the second actuators are responsible for the functional actuation.

Thus, the delay is applied only to the main actuator 120, and below the threshold, a second output function is implemented by the subsidiary actuator 122.

Upon application of a voltage the first load bearing actuator 122 deforms up until a point when it contacts the second actuator 120. Depending upon the parameter choice of the second actuator there are various possibilities, represented schematically in FIG. 16.

FIG. 16(a) shows that if the first and second actuators are identical, the second actuator 120 will immediately deform to the same shape as the first actuator 122 once contact is made, whereby a step function in actuation will occur.

FIG. 16(b) shows that if the second actuator 120 is more responsive than the first 122 (for example with a thinner EAP layer, or a thinner or more compliant substrate), the second actuator 120 will immediately deform further than the first actuator, whereby a larger step function in actuation will occur.

FIG. 16(c) shows that if the second actuator 120 is less responsive than the first (for example it has a thicker EAP layer, or a more robust substrate), the second actuator 120 will deform to a lesser extent than the first actuator, whereby a smaller step function in actuation will occur.

If the second actuator 120 has itself a threshold voltage for actuation beyond the voltage required to cause contact (for example by using the threshold or breakover design described above), the second actuator will not deform until the voltage is further increased, whereby no immediate step in actuation will occur.

After contact is made, both actuators will continue to deform as the voltage increases, until they reach their final actuation state.

Figure 16:
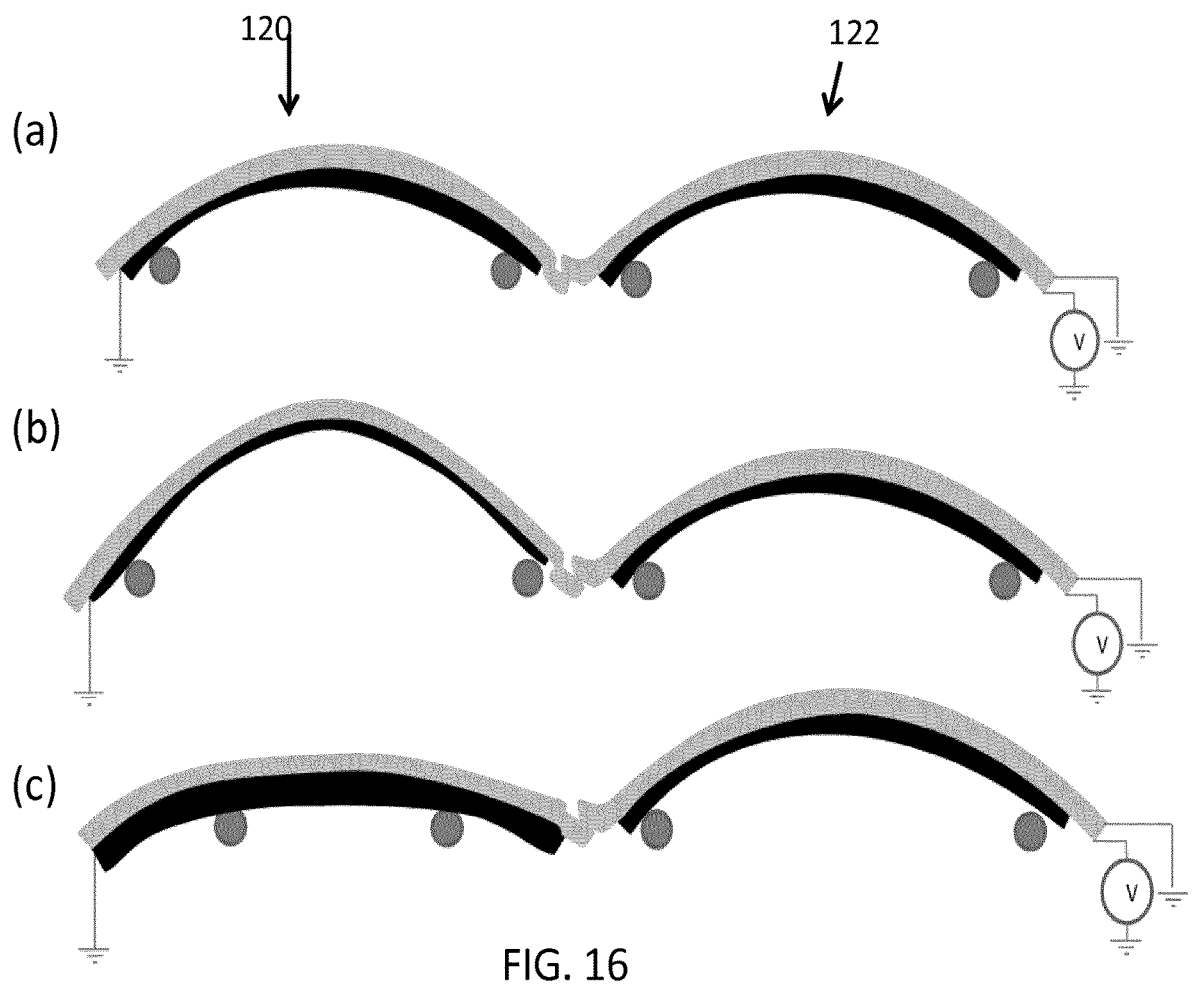
FIG. 16 shows a different examples based on the approach of FIG. 15.

Thus, in the examples of FIG. 16, when 0V is applied both actuators have zero displacement. When a voltage is applied the first actuator 122 starts to bend. When the bending is high enough to make contact with the second actuator, the second actuator 120 experiences the same voltage instantaneously. The second actuator can be made to deliver the same displacement as the first actuator, more than the first actuator or less than the first actuator.

A modification to this approach is to have a number (more than 2) of actuators in a sequence, where the first actuator is a load bearing actuator which covers only a certain part of the full actuator output area. In general, there may be a set of three or more EAP structures in series, wherein upon deformation of one EAP structure by a predetermined amount the applied drive signal is coupled to the next EAP structure.

Figure 17:
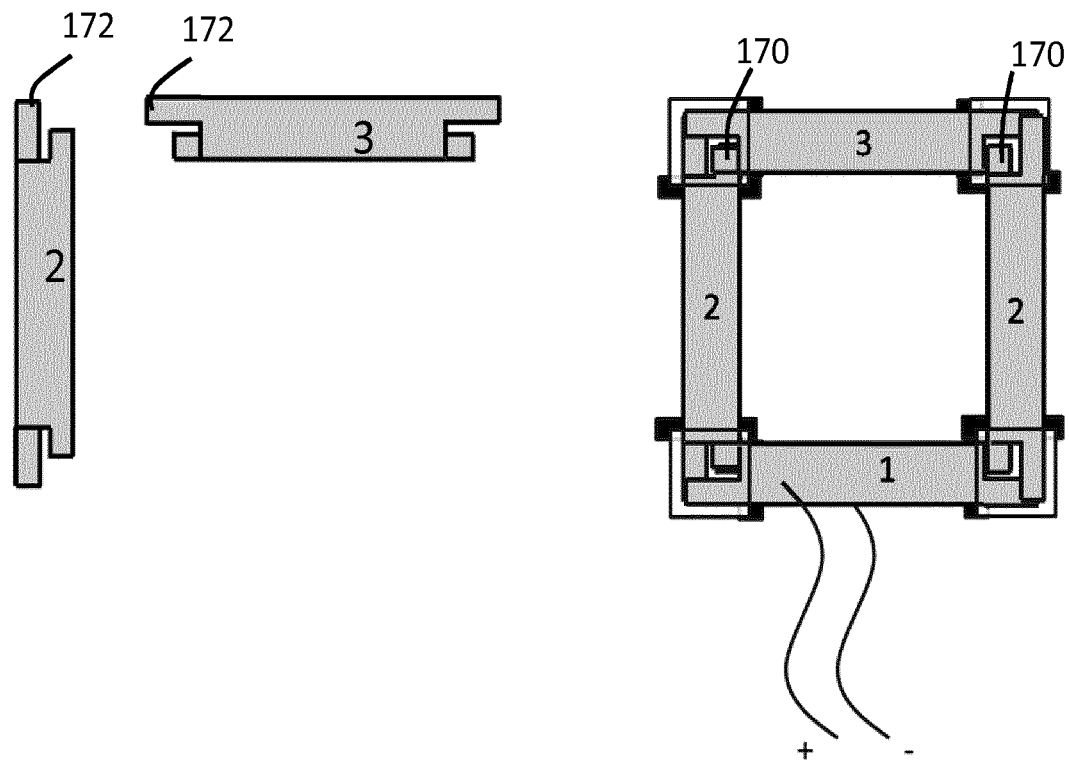
FIG. 17 shows an eighth example of EAP device.

FIG. 17 shows an example in which four actuators are arranged in a sequence which provides an open format actuator, with pivoting clamps 170 on the inner edges of the corners.

The ends of each individual actuator will bend down if the actuator generally bends upwardly. The movement of the outer edges 172 is used to make contact between the left-right and up-down actuators. The number of actuated devices depends on the applied voltage.

For example, the up-down actuators (labeled as 2) are powered when the bottom actuator (labeled as 1) has deformed enough to make contact at the electrodes 172. The top electrode (labeled as 3) is only actuated when the vertical actuators are deformed enough.

Thus, at $V<V_{T1}$, the bottom actuator (1) is deformed but does not contact the other adjacent load bearing actuators (2). At $V_{T1}<V<V_{T2}$, the bottom actuator (1) is deformed enough to contact the side actuators (2) and deform them but not enough to deform the top actuator (3). At $V>V_{T2}$, all actuators are deformed.

As mentioned above, another way to implement the delay function is by introducing a sticking property.

Figure 18:
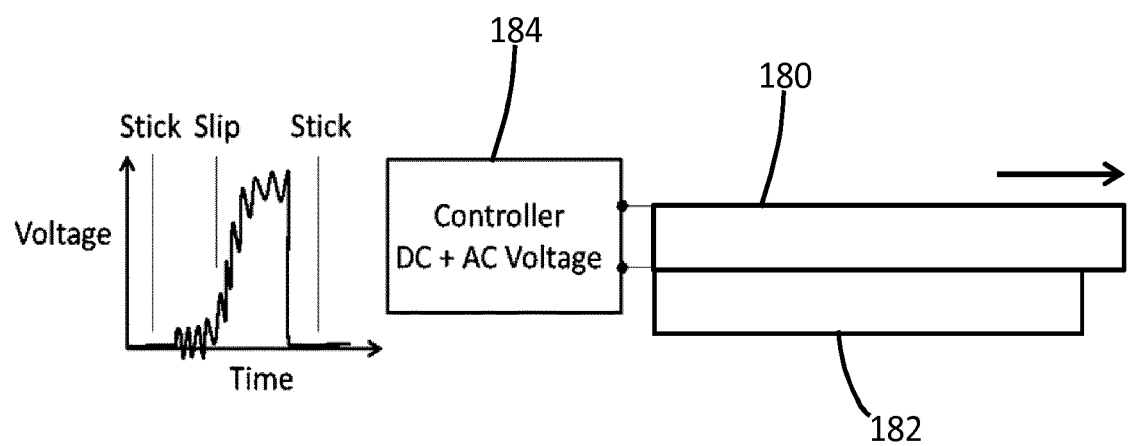
FIG. 18 shows a ninth example of EAP device.

FIG. 18 shows an implementation in which the expansion of the EAP layer 180 is constrained to be in-plane.

Figure 1:
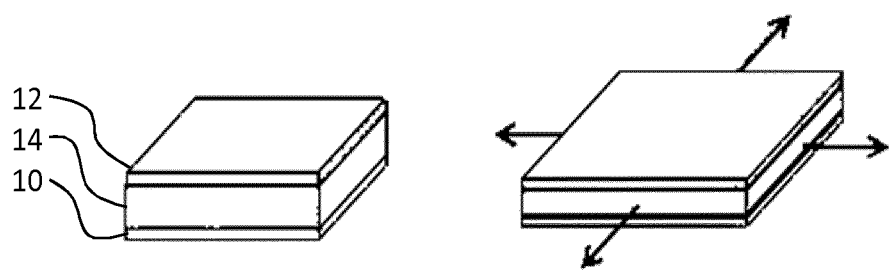
FIG. 1 shows a known EAP device which is not clamped.

This design could be based on a free standing EAP (as in FIG. 1). For example, the two layers may be fixed at one side, such as the left side as shown in Figure, and otherwise be free to expand in all directions.

The layer is provided against a substrate 182 and there is frictional resistance between them which resists the relative sliding movement until the frictional force is overcome.

In this way, the friction functions as the delay arrangement, and determines the threshold.

In order to drive the device in a way which overcomes the friction, an ac drive scheme may be used. For example a controller 184 is used to apply a high frequency ac ripple added to a dc driving signal to enable relative slippage when the actuator moves from one position to a next position. The next position can also be held by removal of the applied voltage due to the friction, so that a bistable effect is obtained. The device and its AC driving can be implemented as described in the non-prepublished patent application with Applicants docket number 2015PF00205 and its contents are herewith incorporated by reference.

As shown in the voltage time profile in FIG. 18, the driving of the device starts with an ac voltage with only a small dc offset. EAPs actuate in an oscillating way for an oscillating frequency so that there will result a vibration around the non-actuated state. This will result in a reduction of friction and prepare the EAP layer for a smooth actuation movement, which occurs as soon as the driving voltage increases.

The EAP layer then continues to deform during the next time period depicted in the graph, where there are active vibrations during the deformation (induced by the ac component superimposed on the rising dc voltage level).

Finally, following a short period where the ac signal is superimposed upon an essentially constant dc level, to allow for any delay in the movement of the EAP layer in reaching its final state, the voltage is removed which, if the residual friction is sufficient, will result in a second stationary state being retained. Subsequently the device can be reset by applying only a small ac signal to overcome the friction and bring the device back to its original state. Hence the device has multiple arbitrary stable states with a reset possibility. In this embodiment, it may be advantageous to reduce the ac signal amplitude slowly to allow the device to settle into its most stable (highest friction) state.

The various examples described above essentially provide an actuator device which has a threshold function.

As mentioned above, in certain applications, an array of actuators can be useful, for instance in positioning systems and controlled topology surfaces. However, as the driving voltages of the actuators are fairly high (above 50V), it quickly becomes expensive to drive each actuator individually with its own driver IC.

A passive matrix array is a simple implementation of an array driving system using only row (n rows) and column (m columns) lines where between each crosspoint of a row line and a column line a device to be driven is connected for its driving. It has a lower cost and complexity than active matrix variants, as the latter require more wiring, more complex drivers and additional switching means in the cross points. As in the passive matrix a driver arrangement only requires (n+m) drivers to address up to (n×m) devices (actuators), this is a far more cost effective approach—and also saves cost and space of additional wiring.

A device according to the invention can be connected to the row (first connection line) and column line (second connection line) in such a way that one electrode of the electrode arrangement is connected to the row line while the other electrode of the electrode arrangement is connected to the column line. In case the device according to the invention comprises one or more further actuation members having further electrode arrangements (e.g. such as devices as exemplified with FIGS. 12 to 16), the connections are made with the further electrode arrangement of the actuator arrangement that provides the first delay of drive signal transfer. For example, the grounded electrodes of the device of FIG. 12 are both connected to a row line (which does not itself need to be a ground line), while the other electrode of the smallest actuation member (the further actuation member) is connected to the column line.

There are various possible passive matrix addressing schemes. In general however it is desired that an actuator device addressed in the passive matrix maintains its state without active driving circuitry until it can be refreshed again. To this end, the driving signal Snm is divided into a row or select signal (Ssel/unsel) and a column or data signal (Sdr). Differently worded, the select signal and the data signal together form the drive signal. The select signal determines the row that is being addressed and all n devices on a row are addressed simultaneously. When devices on a row are being selected or addressed, a select signal level (Ssel, such as e.g. Vsel voltage) is applied, and all other rows are unselected with an unselect signal level (Sunsel such as e.g. Vunsel voltage). The data signal (Sdr) is then applied with a data signal level for each m columns individually. An on-device thus is driven with an on data signal level (Son such as e.g. Von voltage) and driving of an off-device corresponds to providing an off data signal level (Soff such as e.g. Voff voltage). The drive signal provided to respectively a selected device and an unselected device connected to row i and column j is then defined by the difference between the voltages applied over the crossing lines and is therefore defined by:

Snm(selected device)=Sdr−Ssel and

Snm(unselected device)=Sdr−Sunsel

The data signal Sdr provided, determines whether an actuator device on the selected row is on or off, i.e. delivers output or not, and if it is on, how much actuation is provided.

Ideally in a passive matrix device each individual actuator should be capable of being actuated up to its maximum voltage without influencing the adjacent actuators, i.e. without providing crosstalk induced actuation of devices. However, in traditional EAP actuated devices, i.e. one without a signal threshold, some cross talk to adjacent actuators will be present. When a drive signal is applied to actuate one actuator, the actuators around it also experience a voltage and will partially actuate, which is an unwanted effect for many applications. Thus, by way of example, suppose that the array of FIG. 19 (a) has traditional EAPs on the cross points of the row and column lines (indicated with the circles) operated by voltage signals. Upon selection of row one by providing it with Ssel=−Vth as a non-zero voltage and simultaneously providing the columns with Sdr=non-zero Vdr V or Sdr=0V, the dark colored circle indicated actuator devices will have a full driving voltage of (Vdr+Vth) V. However, other devices will have voltages of either (Vdr+0) V when on columns having Vdr and on rows other than row one, or will have voltages of (0+Vth) V when on rows having −Vth and on columns other than columns one or three. Hence all other devices will be partly actuated giving the crosstalk output.

An actuator that has a threshold voltage before it generates its output (e.g. actuation deformation) as described for e.g. any of the above examples enables a passive matrix or a multiplexed device (i.e. a multiplexed segmented actuator array) to be formed without or with reduced crosstalk. Ideally it is possible to apply a non-zero voltage up to a threshold level before the actuator actuates such that the device gives an output. This threshold voltage may for example be of the order of, or higher than the voltage required to change the shape of the actuator.

Using such threshold based actuator devices, many arrays of devices to driven with many drive schemes are enabled. Some of these arrays and drive schemes are described below. The schemes will be described using voltage signals as most actuators based on EAM materials are voltage driven devices. It will however be appreciated that similar concepts as described below hold in general for other types of signals that can be used to drive the actuators. As described above this may depend on the actual actuator materials used in such devices.

In general, for an actuator device according to the invention having the first and second drive signals, the drive signal Snm delivered by a driver should either be a first drive signal or a second drive signal. Thus, while providing a device with an Snm of the type of the second drive signal (for actuation), the Snm on other devices caused as a consequence of crosstalk should thus preferably be of the type of the first drive signal. If a threshold drive signal is defined by the actuator device, then Snm is below or equal to the threshold drive signal for the first drive signal and above the threshold drive signal for the second drive signal. The signals Ssel/unsel and Sdr/data are thus preferably chosen such that the prerequisites for Snm are fulfilled. Some examples of drive schemes implementing these general considerations are given below.

Addressing Scheme 1

Figure 19:
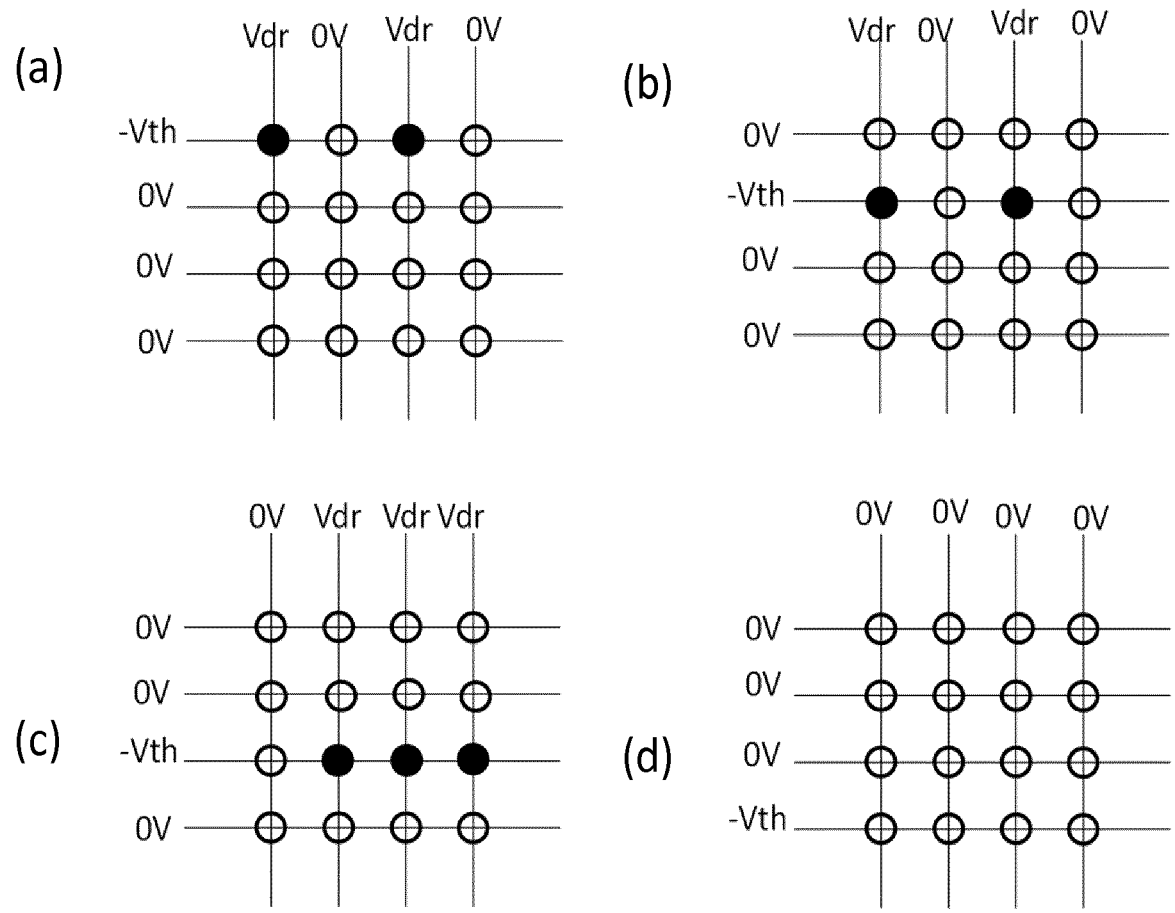
FIG. 19 is used to explain a first passive matrix addressing scheme.

FIG. 19 is used to explain a passive matrix scheme with one line at a time addressing. In this case, the actuation devices at a crosspoint are according to one of the options of the invention such that they are voltage driven actuators where the devices have a threshold voltage Vth below which device output is substantially absent and above which device output is generated.

In this example, the threshold voltage (Vth) of a device exceeds the range of voltages of the data signal Vdr namely Vth>Vdr at any one desired driving signal. The Vdr is the data voltage range required to fully actuate the EAM device. This situation is shown in FIG. 13, where the data voltage range Vdr is shown as the voltage range above $V_T$. This means that if 0V is applied to one electrode of the actuation structure of a device and the full data voltage Vdr is applied to the other electrode, the actuator is not actuated at all as the driving signal then would still only amount to Vdr+0V which is below Vth. Instead of the 0V on the other electrode, a negative voltage is needed on the other electrode, to make the overall voltage difference, i.e. the device drive signal, greater than Vth.

In the example, the array is driven by row drivers capable of providing two-level addressing signals, i.e Ssel=−Vth (or ideally just below the threshold voltage) V (select signal with select signal level −Vth) and Sunsel=0V (unselect signal with unselect signal level of 0V). The column driver is capable of providing two-level or multi-level data signals, i.e Sdr (Sdata) of between 0V (first signal level) and Vdr V (second signal level).

The driver thus makes use of a low Ssel, a high upper Vdr and a reference signal of 0V inbetween these two. The reference signal need not be 0V, but can be at another potential. This is a somewhat simpler example of a more general driver that makes use of more independent reference signals.

The actuator devices have a Vth only above which device output is generated. Thus the maximum first drive signal, i.e. the first range of drive signals that generates no output, has an upper limit equal to the threshold voltage.

In this example, the driver and/or the actuator devices are configured such that the Ssel and Sunsel as well as the Sdr or Sdata levels are delivered with the values chosen such that constitute the first drive signal, while the Snm as defined above constitutes the second drive signal. Hence, more specifically, the absolute value of the difference between the first signal level and the third signal level and that of the difference between the fourth signal level and the second signal level provides the first drive signal, i.e are, smaller than the maximum first drive signal (or the Vth). Differently put, the differences are thus either Vth or Vdr and both are lower than the Vth so that for these kind of crosstalk signals no output is generated).

Addressing the array proceeds in the manner explained in FIG. 19 which shows an example of a 4×4 array.

All rows are initially addressed with 0V (unselected), that is, have 0V applied to the rows. In this situation, the maximum voltage difference across an individual device is Vdr (the maximum voltage from a column driver). As this is below Vth, all devices in the array will be in the non-actuated mode.

Then, as shown in FIG. 19(a), the first row 1 is addressed (selected) with −Vth (or just below −Vth). Two columns 1 and 3 are driven with voltage Vdr, and two columns 2 and 4 with 0V. In this situation, the voltage difference across the two devices on column 1 and 3 is (Vdr+Vth) V (using the maximum voltage from a column driver, Vdr). As this is above Vth, these two devices in the row will be in the actuated mode as shown by solid circles. The voltage difference across the other two devices on column 2 and 4 is (0+Vth) V (using the minimum voltage from a column driver, 0V), whereby these two devices in the row will be in the non-actuated mode. Also the voltage differences across the devices on rows other than 1 and on columns 1 and 3 have non-zero voltage differences of (Vdr+0) V. This is however still below the Vth and hence also these devices are still in non-output mode.

The first row then reverts to addressing signal of 0V and all actuators in the row revert to the non-actuated mode.

The second row is then addressed (selected) with −Vth as shows in FIG. 19(b). On off commences in the same way as for selection of the row 1.

The second row then reverts to addressing with 0V and all actuators in the second row revert to the non-actuated mode.

The third row is then addressed with −Vth as shown in FIG. 19(c). Now three columns are driven with voltage Vdr, and one column with 0V. In this situation, the voltage difference across three of the devices is (Vdr+Vth) V (using the maximum voltage from a column driver, Vdr). As this is above Vth, these three devices in the row will be in the actuated mode. The voltage difference across the other device is (0+Vth) V (using the minimum voltage from a column driver, 0V), whereby this device will be in the non-actuated mode.

The third row then reverts to 0V and all actuators in the row revert to the non-actuated mode The forth row is then addressed with −Vth as shown in FIG. 19(d). Here all four columns are driven with voltage 0V. In this situation the voltage difference across all four devices is (0+Vth) V (using the minimum voltage from a column driver, 0V), whereby all devices in the row will be in the non-actuated mode.

The forth row then reverts to 0V and all actuators in the row remain to the non-actuated mode.

The row addressing then follows a new cycle.

In this manner it is possible to individually actuate all devices in the array one line at a time, whereby the devices are actuated in a sequential manner. The column driver or data driver is used to actuate or not actuate a device on a row and to determine to what extent (grey scale type actuation) such device is actuated. This data signal can be a continuously variable or analogue data signal in the range between 0V and Vdr max. Alternatively that data signal can be a stepwise variable (digital) data signal in the range between 0V and Vdr max.

One feature worthy of note is that whilst an individual actuator, a multiplicity of up to m actuators along a row, a multiplicity of up to n actuators along a column, or a number of repeated row or repeated columns can be actuated at a given time, it is in general not possible to have any random pattern of actuators in the array actuated at the same time, as there is no memory built into the actuators. One such example is described in addressing scheme 3, below. When the voltage is removed the actuators stop actuating so that the actuators in multiple rows will not be on at the same time.

Addressing Scheme 2

Figure 20:
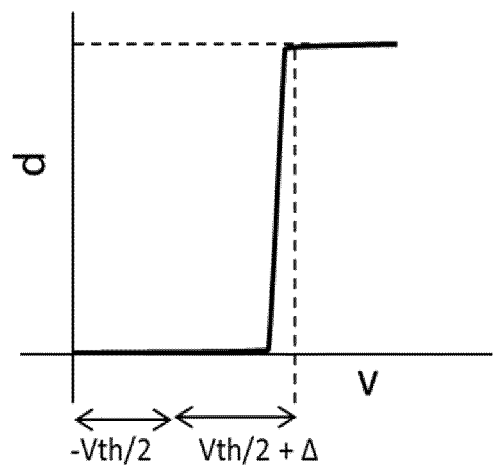
FIG. 20 shows an ideal displacement-voltage characteristic which enables passive matrix addressing with lower voltages.

The scheme of FIG. 19 can be modified to make use of reduced voltage drivers. This is advantageous as actuation voltages (or in general signals) for the EAM based actuators and especially EAP based actuator devices can be quite high such as in the tens of volts or hundreds of volts ranges. For actuators—like the sequential actuators of FIG. 12—with a perfect or nearly perfect step function displacement as shown in FIG. 20, the columns can be driven by providing voltages Vdr>Vth/2 V and the rows can be provided with voltages Vsel=−Vth/2 V.

Vdr is slightly larger than Vth/2 V, for instance (Vth/2+Δ) V. Together the driving voltage (Vdr−Vsel)>Vth by ΔV which is enough to actuate the device. The Vdr can be chosen to incorporate any Δ.

This has an advantage that the driving voltage by each driver can be kept as low as possible (which limits cost of the ICs). It also ensures that the voltage on the non-actuated devices in the matrix is much lower than Vth, which allows for some margin should the threshold voltage of the device decrease over time or due to temperature fluctuations. Also the non-actuated devices are only electrically stressed by Vth/2 instead of Vth, which could also increase lifetime if lifetime is determined by peak voltage.

If lifetime is determined by a combination of peak voltage and duty cycle, the scheme of FIG. 19 may instead be preferred. In that case, although the peak voltage is higher (Vth) it is only applied for a short time whilst one line of the array is addressed and hence there is a very low duty cycle. All other devices only receive at most Vdr, and Vdr<Vth.

Other values of Vdr (column voltage) and Vs (row voltage) are also possible as intermediate solutions (Vsel up to Vth and Vdr up to Vdr), so that there is a trade-off between the driving voltage levels and the device actuation range.

Whilst the above scheme may reduce driver costs in arrays with only two driving levels, the situation may be different in arrays where multiple driving levels are required (i.e. when the devices need to be actuated to different levels). In this case, the data drivers become more expensive. Hence in situations where the threshold does not drift the lowest cost solution may still be to minimize the voltage on the data (column) driver and maintain that of the addressing (row) driver close to −Vth.

Addressing Scheme 3

Sometimes it is desirable to actuate many devices at the same time, whereby it is necessary to address multiple lines at the same time. Therefore in another example an array of actuator devices is provided with a threshold voltage (Vth) as described above. As with the scheme 1, the threshold voltage again exceeds the data voltage range (as explained above) required to fully actuate the device (Vdr) namely Vth>Vdr.

The array is driven by row drivers capable of providing two level addressing signals of 0V and −Vth (again ideally just below Vth) and column drivers capable of providing two level or multi-level data signals of between 0V and Vdr V.

Figure 21:
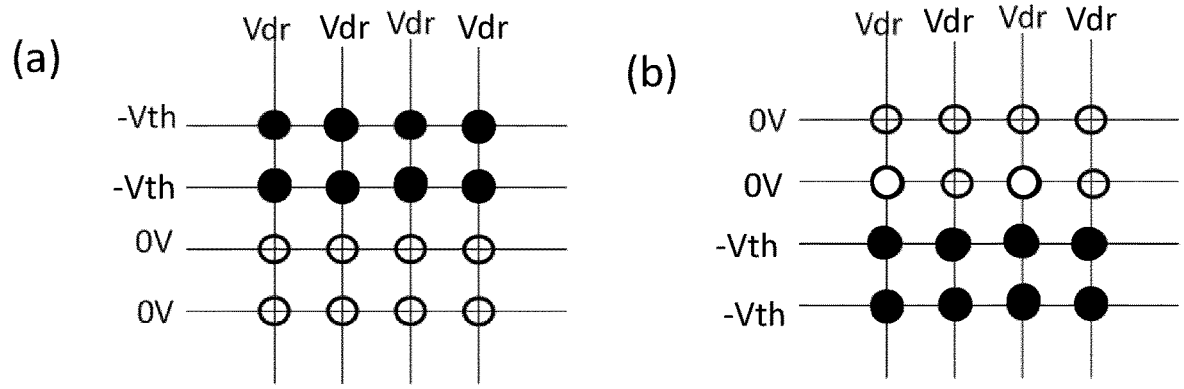
FIG. 21 is used to explain a second passive matrix addressing scheme.

Addressing the array proceeds as described below, with reference to FIG. 21. In this example, alternatively all devices in the top half (FIG. 21 (a) and the bottom half (FIG. 21 (b) of the array are actuated.

All rows are initially addressed (unselected) with 0V (Not shown in the Figure). In this situation, the maximum voltage difference across a device is Vdr (the maximum voltage from a column driver). As this is below Vth, all devices in the array will be in the non-actuated mode.

As shown in FIG. 21(a), the first and second rows are addressed (selected) with −Vth. All columns are driven with data voltage Vdr, In this situation, the voltage difference across all devices in the top two rows of the array is (Vdr+Vth) V (using the maximum voltage from a column driver, Vdr). As this is above Vth, these two rows of devices will be in the actuated mode. Accordingly, the lower two rows, rows 2 and 4 are unselected with 0V selection signal, such that devices on these rows are driven with voltage signals of (Vdr+0) V, which is below Vth. Hence these devices are off.

The first and second rows revert to 0V and all actuators in the rows revert to the non-actuated mode.

The third and fourth rows are addressed with −Vth as shown in FIG. 21(b). All columns are driven with voltage Vdr, In this situation, the voltage difference across all devices in the bottom two rows of the array is (Vdr+Vth) V (using the maximum voltage from a column driver, Vdr). As this is above Vth, these two rows of devices will be in the actuated mode. Now the above two rows 1 and 2 are driven with 0V selection signals giving the driving signal of (Vdr+0) V, which is insufficient for device output as below Vth.

The third and fourth rows revert to 0V and all actuators in the rows revert to the non-actuated mode.

Again, for an actuator with a perfect step function in displacement, the columns can be driven using lower voltages as explained in the addressing scheme 2.

Thus, this scheme provides addressing of rows with the same content at the same time.

Addressing Scheme 4

As explained with reference to FIG. 18, there are device designs in which the delay function is implemented based on a retaining structure such as the one implementing the retaining by physical frictional properties of the device. Such devices can require an addressing scheme that differs somewhat form the ones of schemes 1 to 3. For example, the one of FIG. 18 can be driven making use of an Alternating Current drive component. In general, the higher the AC ripple added to the driving signal, the lower the friction.

This friction controlled threshold behavior may be used to drive an array of AC driven devices. In this case, the driving proceeds as follows:

In a first example of this scheme, an AC voltage is applied to the addressing lines (the rows). In the absence of the ac addressing signal the device will not be actuated up to a certain maximum data voltage (Vdr) which is to be applied to the columns. In the presence of the AC addressing signal the device will be actuated to a level determined by the data voltage (Vdr) which is to be applied to the columns.

The array is driven by row drivers capable of providing AC addressing signals $V_{AC}$ and column drivers capable of providing (multi-level) DC data signals of amplitude between 0V and Vdr V.

Figure 22:
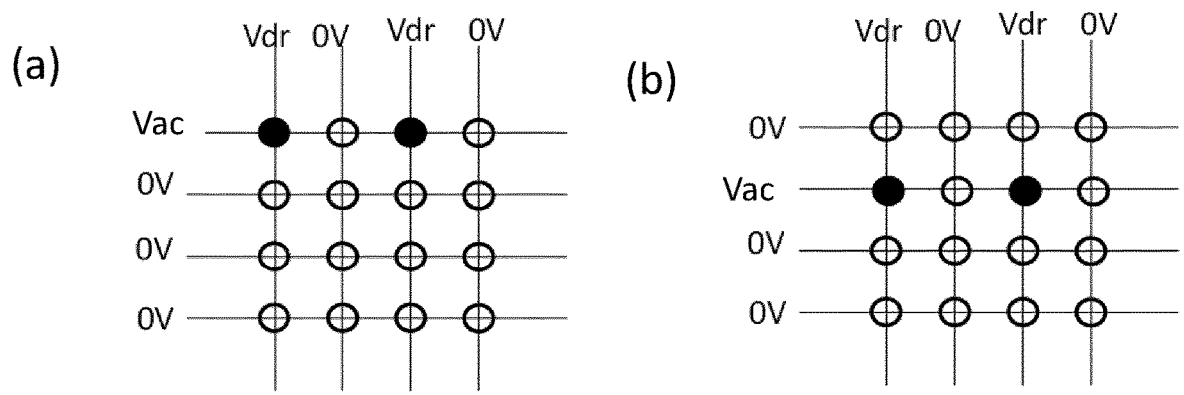
FIG. 22 is used to explain a third passive matrix addressing scheme.

FIG. 22 is used to explain the operation but only considering the first two rows. In this case, the driving proceeds as follows.

All rows are initially addressed (unselected) with 0V. In this situation, the maximum voltage difference across a device is Vdr (the maximum voltage from a column driver). As there is no ac signal applied to the rows, there will be no actuation of the devices.

The first row is addressed with $V_{AC}$ as shown in FIG. 22(a). Two columns are driven with voltage Vdr, two columns with 0V as shown. In this situation, the voltage difference across two of the devices is (Vdr+$V_{AC}$) V (using the maximum voltage from a column driver, Vdr). As there is an ac voltage superimposed upon the dc voltage Vdr, these two devices in the row will be in the actuated mode since friction preventing the actuation is reduced releasing the actuation member of the device for it to provide its output based on the column driving signal. The voltage difference across the other two devices (0+$V_{AC}$) V (using the minimum voltage from a column driver, 0V), whereby these two devices in the row will be effectively in the non-actuated mode (depending upon the value of $V_{AC}$ and the response curve of the device there may be a minimal actuation of the device).

Optionally, all column drivers temporarily revert to 0V, whereby all actuators in the row revert to the non-actuated mode. The first row then reverts to 0V and all actuators in the row remain in the non-actuated mode.

The second row is then addressed with Vac. Again, the same two columns are driven with voltage Vdr, two columns with 0V, as shown in FIG. 22(b). Again, as there is an ac voltage superimposed upon the dc voltage Vdr, these two devices in the row will be in the actuated mode. The voltage difference across the other two devices is Vac+0V=Vac (using the minimum voltage from a column driver, 0V), whereby these two devices in the row will be effectively in the non-actuated mode (depending upon the value of Vac and the response curve of the device, there may be a minimal actuation of the device).

Optionally, all column drivers temporarily revert to 0V, whereby all actuators in the row revert to the non-actuated mode. The second row reverts to 0V and all actuators in the row remain in the non-actuated mode. The addressing continues row by row.

These ac driving schemes can also be used in the case of sequentially operated actuators, in which case the switching actuator is controlled by the ac driving component. The addressing and driving signals will be applied to the the switching actuator as this is the actuator which defines if the second actuator (the load bearing actuator) is indeed actuated.

Whilst in the above examples the ac signals are applied to the rows, they may equally be applied to the columns. It is also possible to apply ac signals to both rows and columns. In this case it is possible to make use of either an out of phase condition and/or a variable amplitude signal to actuate the devices in certain positions in the matrix in such a way that the voltage is always zero if not actuated and at a certain voltage (obtained by re-phasing the signals) if actuated.

The various driving schemes explained above can be applied to all of the actuators designs described above which exhibit a threshold voltage. In the case of sequential actuators, the addressing and driving signals will be applied to the first of the two actuators (the switching actuator) as this is the actuator which defines if the second actuator (the load bearing actuator) is indeed actuated.

Clearly the array may be symmetric, so the terms row and column are somewhat arbitrary. It would equally be possible to apply the addressing driver to the columns and the data driving to the rows, whereby the array would be addressed one column (or multiple columns) at a time.

In the above examples only a two level data driver is described in detail (0V and Vdr). This will result in the lowest cost driver IC's. However in alternative embodiment it may be preferred to also partially actuate the actuators. To enable this, a data driver with multiple data voltages up to Vdr will be required.

For actuator devices with a perfect step function, Vth needs to be slightly lower than the threshold. This is needed to avoid a whole row of actuators responding when −Vth is applied, because the devices are symmetric. This will also be required since the devices themselves also act as capacitors. So if one is addressed and later should not be addressed it might give enough current to a neighboring device to address the unwanted device for a short time period.

Whilst the devices as described here revert to their original state when the voltage drops below Vth, the rate of relaxation to the original state may be slow (as it is determined by the mechanical properties and not by the drive voltage). For this reason in some embodiments it may be beneficial to apply a reset to bring the actuators to their original state. Since EAM based devices are symmetric in deformation, the reset voltage must be converted to an opposing actuation in the device by an additional mechanism. For instance, the reset can be applied by an actuator working against the functional actuator, so it is able to drive the mechanical reset. This opposing actuator could be a single actuator or set of individual actuators which are all connected to the same (reset) driver. Alternatively the reset may be a mechanical reset (such as a push) or a pressure reset (such as a vacuum).

The reset may be applied to actuators in all rows and columns of the array just before the next row is to be addressed. All devices are reset to their non-actuated state. Alternatively the reset may be applied to just the single row which is being actuated just before the next row is to be addressed.

The array has been described along the electoractive material based devices. It will be evident however that a system using optically driven active materials can also be made. The connections and signal lines then need to be arranged for guiding optical signals to the devices. Thus electrodes need to be optical guide wires and layers for providing light to the active materials in the actuation arrangements. The system and method of driving will have their advantageous effect for these arrays also.

The electrode arrangement may comprise electrodes on opposite faces of the EAM layer as shown above, for a field driven device. These provide a transverse electric field for controlling the thickness of the EAM layer. This in turn causes expansion or contraction of the EAM layer in the plane of the layer.

The electrode arrangement may instead comprise a pair of comb electrodes on one face of the EAM layer. This provides in-plane electric field, for directly controlling the dimensions of the layer in-plane.

Although in the detailed description herein above the construction and operation of devices and systems according to the invention have been described for EAPs, the invention can in fact be used for devices based on any kind of EAM material. Hence, unless indicated otherwise, the EAP materials hereinabove can be replaced with other EAM materials. Such other EAM materials are known in the art and the person skilled in the art will know where to find them and how to apply them. A number of options will be described herein below.

Among the many EAM devices, a common sub-division is into those based on field-driven and ionic-driven EAMs. Field-driven EAMs are actuated by an electric field through direct electromechanical coupling, while the actuation mechanism for ionic EAPs involves the diffusion of ions. Both classes have multiple family members, each having their own advantages and disadvantages.

Many field driven EAMs, of organic or inorganic nature exist. For example, The EAM material can be a relaxor ferroelectric inorganic material. Such materials can have an electrostrictive constant that is high enough for practical use. The most commonly used examples are: lead magnesium niobate (PMN), lead magnesium niobate-lead titanate (PMN-PT) and lead lanthanum zirconate titanate (PLZT).

A special kind of EAM materials are organic electroactive materials OEAMs to which also Electroactive polymers (EAPs) belong. The organic materials and especially polymers are an emerging class of materials of growing interest as they combine the actuation properties with material properties such as light weight, cheap manufacture and easy processing.

Field-driven EAPs are actuated by an electric field through direct electromechanical coupling. They usually require high fields (volts per meter) but low currents. Polymer layers are usually thin to keep the driving voltage as low as possible. Ionic EAPs are activated by an electrically induced transport of ions and/or solvent. They usually require low voltages but high currents. They require a liquid/gel electrolyte medium (although some material systems can also operate using solid electrolytes). Both classes of EAP have multiple family members, each having their own advantages and disadvantages.

Electro-active polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

A first notable subclass of Field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of filed driven EAPs is that of Dielectric elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

Examples of field-driven EAPs are dielectric elastomers (preferably clamped between electrodes in the actuation structure), electrostrictive polymers (such as PVDF based relaxor polymers or polyurethanes) and liquid crystal elastomers (LCE). Examples of ionic-driven EAPs are conjugated polymers, carbon nanotube (CNT) polymer composites and Ionic Polymer Metal Composites (IPMC).

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is Conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

Additional passive layers may be provided for influencing the behavior of the EAM layer in response to an applied electric field.

The EAM layer may be sandwiched between electrodes, but other electrode configurations can be used such as alternating on one side of the EAM layer either with or without electrodes on the other side of the EAM layer. The electrodes may be stretchable so that they follow the deformation of the EAM material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrolle (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C—C bond length. As a result, expansion and contraction of single CNT can be observed. The materials for the different layers will be selected for example taking account of the elastic moduli (Young's moduli) of the different layers.

Additional layers to those discussed above may be used to adapt the electrical or mechanical behavior of the device, such as additional polymer layers.

The EAM devices may be electric field driven devices or ionic devices. Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

Optically driven active materials also sometimes called photo-responsive shape change materials can be found in the prior art (which are incorporated by reference in their entirety) such as for example in:

Photo-Responsive Shape-Memory and Shape-Changing Liquid-Crystal Polymer Networks by Danish Iqbal, and Muhammad Haris Samiullah in Materials 2013, 6, 116-142;

amplitude light-induced motion in high elastic modulus polymer actuators by Harris, K. D.; Cuypers, R.; Scheibe, P.; van Oosten, C. L.; Bastiaansen, C. W. M.; Lub, J.; Broer, D. J. in J. Mater. Chem. 2005, 15, 5043-5048;

Synthesis of a Photoresponsive LiquidCrystalline Polymer Containing Azobenzene by Chensha Li, Chi-Wei Lo, Difeng Zhu, Chenhui Li, Ye Liu, Hongrui Jiang, in Macromol. Rapid Commun. 2009, 30, 1928-1935 2009;

Optical Nano and Micro Actuator Technology, edited by George K. Knopf, Yukitoshi Otani, CRC Press, Taylor and Francis Group, 2013;

Light-driven actuators based on polymer films by Sergey S. Sarkisov; Michael J. Curley; LaQuieta Huey; Aisha B. Fields; in Optical Engineering Volume 45, Issue 3, March 2006; and Large amplitude light-induced motion in high elastic modulus polymer actuators by Harris, K. D., Cuypers, R., Scheibe, P., Oosten, C. L. van, Bastiaansen, C. W. M., Lub, J. & Broer, D. J. (2005). *Journal of Materials Chemistry*, 15(47), 5043-5048;

It will be evident to the person skilled in the art that when any of the materials of the above prior art is used in the device of the invention that an appropriate part for providing the appropriate drive signal can also be incorporated.

The device may be used as a single actuator, or else there may be a line or array of the devices, for example to provide control of a 2D or 3D contour.

The invention can be applied in many applications, including examples where a passive matrix array of actuators is of interest.

In many applications the main function of the product relies on the (local) manipulation of human tissue, or the actuation of tissue contacting interfaces. In such applications EAM actuators provide unique benefits mainly because of the small form factor, the flexibility and the high energy density. Hence EAM's can be easily integrated in soft, 3D-shaped and/or miniature products and interfaces. Examples of such applications are:

Skin cosmetic treatments such as skin actuation devices in the form of EAM-based skin patches which apply a constant or cyclic stretch to the skin in order to tension the skin or to reduce wrinkles;

Respiratory devices with a patient interface mask which has an EAM-based active cushion or seal, to provide an alternating normal pressure to the skin which reduces or prevents facial red marks;

Electric shavers with an adaptive shaving head. The height of the skin contacting surfaces can be adjusted using EAM actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAM transducers which is integrated in or near the user interface;

Catheters with a steerable tip to enable easy navigation in tortuous blood vessels.

Another category of relevant application which benefits from EAM actuators relates to the modification of light. Optical elements such as lenses, reflective surfaces, gratings etc. can be made adaptive by shape or position adaptation using EAM actuators. Here the benefits of EAPs are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A system comprising a plurality of devices, each of the plurality of devices comprising:
   an actuation arrangement arranged to provide a mechanical actuation, the actuation arrangement comprising an active material that can deform upon applying a drive signal to the actuation arrangement, wherein an actuation output is dependent on the mechanical actuation; and
   a delay arrangement, wherein the delay arrangement has a delay interaction with the actuation arrangement such that the delay arrangement:
      prevents the actuation output for a first drive signal, wherein the first drive signal is chosen from a first range or a first type of drive signals; and
      allows the actuation output for a second drive signal, wherein the second drive signal is chosen from a second range or a second type of drive signals different from the first range or the first type of drive signals.

2. The system as claimed in claim 1, wherein the plurality of devices is arranged in an array.

3. The system as claimed in claim 1, further comprising a driver arrangement arranged to generate a select signal, a deselect signal, and a data signal,
   wherein at least one of the select signal and the data signal each individually provide the first drive signal chosen from the first range or the first type of drive signals, and
   wherein the select signal and the data signal together form the second drive signal chosen from the second range or the second type of drive signals.

4. The system as claimed in claim 1, further comprising a driver arrangement arranged to generate a select signal, a deselect signal, and a data signal,
   wherein the select signal comprises a select signal level,
   wherein the unselect signal comprises an unselect signal level,
   wherein the data signal comprises a data signal level chosen from a range of levels between a first level and a second higher level,
   wherein an absolute value of a difference between the data signal level and the unselect signal level provides the first drive signal chosen from the first range or the first type of drive signals, and
   wherein an absolute value of a difference between the data signal level and the select signal level provides either the first drive signal chosen from the first range or the first type of drive signals, or provides the second drive signal chosen from the second range or the second type of drive signals.

5. The system as claimed in claim 4, wherein the delay arrangement comprises a retaining arrangement which comprises a support layer arranged in frictional engagement with at least one of the actuation arrangement and an actuation output arrangement, and wherein the select signal comprises an alternating signal with a frequency capable of reducing the frictional engagement.

6. The system as claimed in claimed 1,
   wherein the first range or the first type of drive signals comprises a drive level that is lower than that of the second range or the second type of drive signals, and
   wherein the first range or the first type of drive signals comprises a frequency that is different from that of the second range or the second type of drive signals.

7. The system as claimed in claim 1, wherein the delay arrangement comprises an actuation output arrangement arranged to provide the actuation output.

8. The system as claimed in claim 7, wherein the actuation output arrangement and the actuation arrangement are arranged such that there is a minimum gap between the actuation output arrangement and the actuation arrangement,
   wherein the mechanical actuation reduces the minimum gap such that the mechanical actuation is sufficient to close the minimum gap for a drive signal chosen from the first range or the first type of drive signals, and
   wherein the mechanical actuation is at least sufficient to close the minimum gap for a drive signal chosen from the second range or the second type of drive signals.

9. The system as claimed in claim 7, wherein the delay arrangement comprises:
   an actuation transmission arrangement for providing the delay interaction,
   wherein the mechanical actuation is absorbed by the actuation transmission arrangement for a drive signal chosen from the first range or the first type of drive signals, and
   wherein at least a portion of the mechanical actuation is transmitted by the actuation transmission arrangement to the actuation output arrangement for a drive signal chosen from the second range or the second type of drive signals.

10. The system as claimed in claim 9, wherein the actuation transmission arrangement comprises one or more parts for causing at least one of a magnetic force and an electric force to operate between the actuation arrangement and the actuation output arrangement to thereby provide the delay interaction.

11. The system as claimed in claim 1, wherein the delay arrangement comprises:
   a retaining arrangement for imposing a threshold force to the actuation arrangement to implement the delay interaction, wherein the threshold force works against the mechanical actuation,
   wherein the threshold force is chosen such that a force delivered by the mechanical actuation for a drive signal chosen from the first range or the first type of drive signals is not large enough to overcome the threshold force,
   wherein the force delivered by the mechanical actuation for a drive signal chosen from the second range or the second type of drive signals is large enough to overcome the threshold force.

12. The system as claimed in claim 11, wherein the retaining arrangement comprises a support layer arranged in frictional engagement with at least one of the actuation arrangement and an actuation output arrangement for providing the threshold force.

13. The system as claimed in claim 11, wherein the delay arrangement comprises one or more parts for generating at least one of a magnetic force and an electric force for providing the threshold force.

14. The system as claimed in claim 13, wherein the one or more parts comprise one or more electrodes for applying said at least one of the magnetic force and the electric force.

15. The system as claimed in claim 1, wherein the delay arrangement comprises a drive signal control circuit arranged to:
   receive the drive signal and control application of the drive signal to the actuation arrangement such that the application of the drive signal:
      does not cause the actuation output to the actuation arrangement for a received drive signal chosen from the first range or the first type of drive signals; and
      does cause the actuation output to the actuation arrangement for a received drive signal chosen from the second range or the second type of drive signals.

16. The system as claimed in claim 15, wherein the drive signal control circuit comprises at least one of an electrical component and an optical component for implementing a threshold drive signal that must be overcome by the received drive signal before a drive signal is applied to the actuation arrangement.

17. The system as claimed in claim 15, wherein the drive signal control circuit comprises:
   a further actuation arrangement, the further actuation arrangement providing a further mechanical actuation,
      wherein the further actuation arrangement comprises a further active material,
      wherein the further active material deforms upon applying the drive signal to the further actuation arrangement,
      wherein the deformation of the further active material causes the further mechanical actuation, and
   wherein the further actuation arrangement is arranged for receiving the drive signal and for applying the drive signal to the actuation arrangement such that:
      the further mechanical actuation is not sufficient to cause application of the drive signal to the actuation arrangement for a drive signal chosen from the first range or the first type of drive signals; and
      the further mechanical actuation is sufficient to cause application of the drive signal to the actuation arrangement for a drive signal chosen from the second range or the second type of drive signals.

18. The system as claimed in claim 17,
   wherein the actuation arrangement comprises an electrode for receiving the drive signal,
   wherein the further actuation arrangement comprises a further electrode for providing the drive signal to the electrode, and
   wherein the electrodes are arranged such that:
      the electrode and the further electrode do not provide an electrical contact such that the drive signal can be transmitted to the electrode for a drive signal chosen from the first range or the first type of drive signals; and
      the electrode and the further electrode do provide an electrical contact such that the drive signal can be transmitted to the electrode for a drive signal chosen from the second range or the second type of drive signals.

19. A method of driving a system comprising a plurality of devices, wherein each of the plurality of devices comprises:
   an actuation arrangement arranged to provide a mechanical actuation, the actuation arrangement comprising an active material that can deform upon applying a drive signal to the actuation arrangement, wherein an actuation output is dependent on the mechanical actuation; and
   a delay arrangement, wherein the delay arrangement has a delay interaction with the actuation arrangement such that the delay arrangement:
      prevents the actuation output for a first drive signal, wherein the first drive signal is chosen from a first range or a first type of drive signals; and
      allows the actuation output for a second drive signal, wherein the second drive signal is chosen from a second range or a second type of drive signals different from the first range or the first type of drive signals, the method comprising:
   instructing a driver arrangement to perform the following steps:
      generating a select signal, a deselect signal, and a data signal such that:
         at least one of the select signal and the data signal each individually provide the first drive signal chosen from the first range or the first type of drive signals; and
         the select signal and the data signal together form the second drive signal chosen from the second range or the second type of drive signals.

20. The method of claim 19,
   wherein the select signal comprises a select signal level (Ssel),
   wherein the unselect signal comprises an unselect signal level (Sunsel), wherein the data signal comprises a data signal level (Sdata) chosen from a group of levels consisting of at least a first level and a second higher level, and wherein the signal levels are chosen such that:

an absolute value of a difference between Sdata-Sunsel provides the first drive signal chosen from the first range or the first type of drive signals; and an absolute value of a difference between Sdata-Ssel provides either the first drive signal chosen from the first range or the first type of drive signals, or provides the second drive signal chosen from the second range or the second type of drive signals.

21. A computer program product comprising computer readable code storable on a computer readable medium, or downloadable from a communications network, which code, when executed on a computer, is capable of implementing the steps of a method as claimed in claim 19.

* * * * *